US011945189B2

(12) United States Patent
Boyd et al.

(10) Patent No.: US 11,945,189 B2
(45) Date of Patent: *Apr. 2, 2024

(54) SYSTEMS AND METHODS FOR PRODUCING LAMINATES, LAYERS AND COATINGS INCLUDING ELEMENTS FOR SCATTERING AND PASSING SELECTIVE WAVELENGTHS OF ELECTROMAGNETIC ENERGY

(71) Applicant: FACE INTERNATIONAL CORPORATION, Norfolk, VA (US)

(72) Inventors: Clark D Boyd, Portsmouth, VA (US); Bradbury R Face, Smithfield, VA (US); Jeffrey D Shepard, Norco, CA (US)

(73) Assignee: Face International Corporation, Norfolk, VA (US)

( * ) Notice: Subject to any disclaimer, the term of this patent is extended or adjusted under 35 U.S.C. 154(b) by 662 days.

This patent is subject to a terminal disclaimer.

(21) Appl. No.: 15/006,143

(22) Filed: Jan. 26, 2016

(65) Prior Publication Data

US 2016/0306078 A1    Oct. 20, 2016

Related U.S. Application Data

(60) Provisional application No. 62/147,573, filed on Apr. 14, 2015.

(51) Int. Cl.
| | |
|---|---|
| *B32B 17/00* | (2006.01) |
| *B32B 7/02* | (2019.01) |
| *B32B 7/06* | (2019.01) |
| *B32B 27/06* | (2006.01) |
| *G01J 1/04* | (2006.01) |
| *G02B 1/10* | (2015.01) |
| *G02B 5/02* | (2006.01) |
| *G02B 5/20* | (2006.01) |
| *G02B 5/26* | (2006.01) |
| *G02B 27/10* | (2006.01) |
| *G02F 1/00* | (2006.01) |
| *G02F 1/01* | (2006.01) |
| *G02F 1/13* | (2006.01) |

(Continued)

(52) U.S. Cl.
CPC .............. *B32B 17/00* (2013.01); *B32B 7/02* (2013.01); *B32B 27/06* (2013.01); *G01J 1/0488* (2013.01); *G02B 1/10* (2013.01); *G02B 5/0242* (2013.01); *G02B 5/0263* (2013.01); *G02B 5/0268* (2013.01); *G02B 5/0284* (2013.01); *G02B 5/0289* (2013.01); *G02B 5/201* (2013.01); *G02B 5/206* (2013.01); *G02B 27/1006* (2013.01); *G02F 1/0018* (2013.01); *G02F 1/01* (2013.01); *G02F 1/0102* (2013.01); *G02F 1/0121* (2013.01); *G02F 1/19* (2013.01); *G06F 1/16* (2013.01); *H01L 31/02161* (2013.01); *H01L 31/02168* (2013.01); *H01L 31/02327* (2013.01); *H02S 40/00* (2013.01); *B32B 2255/00* (2013.01); *B32B 2255/20* (2013.01); *B32B 2255/26* (2013.01); *B32B 2255/28* (2013.01); *B32B 2307/404* (2013.01); *B32B 2307/41* (2013.01); *B32B 2307/412* (2013.01); *B32B 2307/418* (2013.01); *B32B 2457/12* (2013.01); *B32B 2559/00* (2013.01); *G01J 2003/1213* (2013.01); *G02B 5/26* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 4,967,956 A | 11/1990 | Mansfield et al. | |
| 5,286,682 A * | 2/1994 | Jacobs | E01F 9/578 501/34 |

(Continued)

FOREIGN PATENT DOCUMENTS

| | | |
|---|---|---|
| JP | 2010020130 A | 1/2010 |
| KR | 20110031645 A | 3/2011 |
| WO | 2014178180 A1 | 11/2014 |

OTHER PUBLICATIONS

International Search Report for PCT/US2016/027393 dated Jul. 29, 2016

(Continued)

*Primary Examiner* — Sheeba Ahmed
(74) *Attorney, Agent, or Firm* — Lowndes; Stephen C. Thomas; Robert R. Fredeking

(57) ABSTRACT

A system and method are provided for forming electromagnetic energy transmissive layers, which are particularly configured to selectively scatter specific and selectable wavelengths of electromagnetic energy, while allowing remaining wavelengths to pass therethrough. Processes are provided by which to form, or otherwise incorporate, one or more energy scattering layers, including uniquely implementing optical light scattering techniques in such energy scattering layers, and to objects, object portions, wall plates, lenses, filters, screens and the like that are formed of, or that otherwise incorporate, such transmissive energy-scattering layers. Refractive indices of particles fixed in a matrix are tunable in order that the finished layers provide an opaque appearance when viewed from an energy-incident excited by light in the visible spectrum. A color, pattern, texture or image of the scattering layer may be rendered according to an individual user's desires, the layers being substantially-transparent to light passing through layers.

10 Claims, 8 Drawing Sheets

(51) Int. Cl.
 *G02F 1/19* (2019.01)
 *G06F 1/16* (2006.01)
 *H01L 31/0216* (2014.01)
 *H01L 31/0232* (2014.01)
 *H02S 40/00* (2014.01)
 *G01J 3/12* (2006.01)

(56) References Cited

U.S. PATENT DOCUMENTS

| | | |
|---|---|---|
| 5,877,874 A | 3/1999 | Rosenberg |
| 8,669,325 B1 | 3/2014 | Hyman |
| 8,963,404 B2 | 2/2015 | Lee et al. |
| 9,118,000 B2 | 8/2015 | Kang et al. |
| 9,193,580 B1 | 11/2015 | Sodano et al. |
| 9,419,544 B2 | 8/2016 | Kim et al. |
| 9,444,031 B2 | 9/2016 | Park et al. |
| 9,541,674 B2 | 1/2017 | Manoharan et al. |
| 9,568,799 B2 | 2/2017 | Lam et al. |
| 9,726,790 B2 * | 8/2017 | Boyd ................. G02B 1/10 |
| 9,726,791 B2 * | 8/2017 | Boyd ................. H01L 31/02168 |
| 2005/0019712 A1 | 1/2005 | Ikeda et al. |
| 2005/0185279 A1 * | 8/2005 | Mullen ................. G02B 5/124 |
| | | 359/530 |
| 2009/0269579 A1 * | 10/2009 | Minaki ................. G02B 5/0825 |
| | | 428/338 |
| 2010/0278561 A1 | 11/2010 | Kanda et al. |
| 2011/0278434 A1 | 11/2011 | Chau et al. |
| 2014/0185282 A1 | 7/2014 | Hsu et al. |
| 2014/0254017 A1 | 9/2014 | Manoharan et al. |
| 2015/0145376 A1 | 5/2015 | Sun et al. |
| 2015/0194911 A1 | 7/2015 | Kim et al. |
| 2016/0134204 A1 | 5/2016 | Al Ahmad et al. |
| 2016/0149517 A1 | 5/2016 | Choi et al. |
| 2016/0294305 A1 | 10/2016 | Kim et al. |
| 2017/0019034 A1 | 1/2017 | Fujita et al. |

OTHER PUBLICATIONS

Written Opinion for PCT/US2016/027393 dated Jul. 29, 2016.
English-language Abstract of KR20110031645 dated Mar. 29, 2011.

* cited by examiner

500

530

550

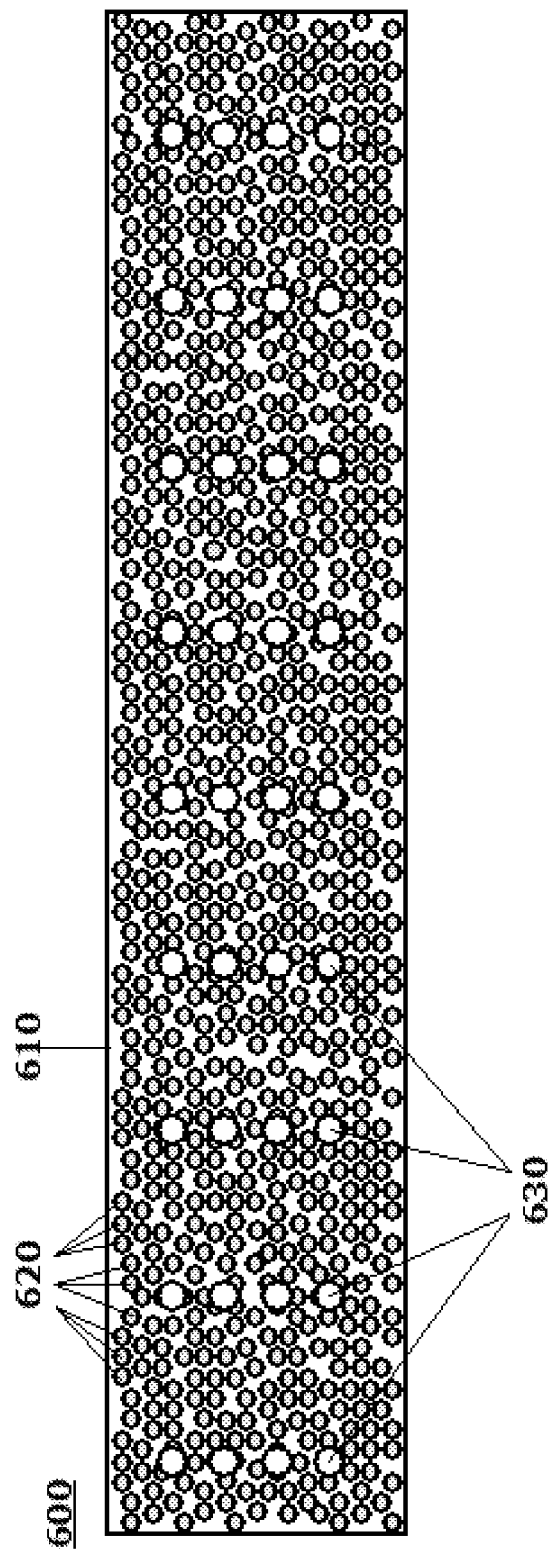

SYSTEMS AND METHODS FOR PRODUCING LAMINATES, LAYERS AND COATINGS INCLUDING ELEMENTS FOR SCATTERING AND PASSING SELECTIVE WAVELENGTHS OF ELECTROMAGNETIC ENERGY

This application claims priority to U.S. Provisional Patent Application No. 62/147,573 entitled "Photovoltaic Cell and/or Photocell with Light Scattering Layer" by Clark D. BOYD et al., filed on Apr. 14, 2015, the disclosure of which is hereby incorporated by reference herein in its entirety. This application is related to U.S. Patent Application Ser. No. 15/006,145, filed in the USPTO on Jan. 26, 2016, entitled "Systems and Methods for Producing Objects Incorporating Selective Electromagnetic Energy Scattering Layers, Laminates and Coatings"], which published as U.S. Patent Publication No. US 2016-0306080 A1 on Oct. 20, 2016, and which issued as U.S. Pat. No. 10,795,062 on Oct. 6, 2020; and U.S. patent application Ser. No. 15/006,148, filed in the USPTO on Jan. 26, 2016, entitled "Systems and Methods for Implementing Selective Electromagnetic Energy Filtering Objects and Coatings Using Selectably Transmissive Energy Scattering Layers", which published as U.S. Patent Publication No. US 2016-0306254 A1 on Oct. 20, 2016, and which issued as U.S. Pat. No. 9,726,790 on Aug. 8, 2017; and U.S. Patent Application Ser. No. 15/006, 150, filed in the USPTO on Jan. 26, 2016, entitled "Systems and Methods for Producing Objects Incorporating Selectably Active Electromagnetic Energy Filtering Layers and Coatings", which published as U.S. Patent Publication No. US 2016-0306255 A1 on Oct. 20, 2016, and which issued as U.S. Pat. No. 9,726,791 on Aug. 8, 2017, the disclosures of which are hereby incorporated by reference herein in their entirety.

BACKGROUND

1. Field of the Disclosed Embodiments

This disclosure relates to systems and methods for forming electromagnetic energy transmissive layers, which are particularly formed to selectively scatter specific wavelengths of electromagnetic energy while allowing remaining wavelengths to pass therethrough, including uniquely implementing optical light scattering techniques in such energy transmissive layers, and to objects, object portions, wall plates, lenses, filters, screens and the like that are formed of, or that otherwise incorporate, such transmissive energy-scattering layers.

2. Related Art

An ability to provide or promote selective transmission of electromagnetic energy, including light in the visual or near-visual radiofrequency (RF) spectrum through layers, materials, structures or structural components provides substantial benefit in a number of real-world use cases and applications. At a simplest level for electromagnetic energy in the optical, or near-optical, spectrum, windows, skylights and the like are provided in structures in order that interiors of the structures are "naturally" sunlit. In certain implementations, the windows or skylights are modified to limit or modify an amount of light that is, or constituent wavelengths of the light that are, transmitted into the structure. In other implementations, the windows or skylights are modified in a manner that limits an ability to see through the component panels of, for example, a particular window or skylight. Such modifications are often incorporated to address rudimentary privacy, or low-level security, concerns. The glass, or other transparent/translucent material, panel may be, for example, frosted, tinted or otherwise modified to provide an ability for the particular window or skylight to pass light, but to not be seen through. Stained-glass windows, for example, are often formed to have a particular image presentation or multi-colored design format, while allowing light to generally pass through in what is then a color-filtered manner. All of these techniques, whether implemented to address simple aesthetics, or for other reasons, modify the light transmissive properties of the windows, and/or constituent panels or panes in some manner, but substantially in both directions equally.

What are alternatively referred to as one-way or two-way mirrors are often used for one-way observation in which a viewing room is kept dark in order that an observer can see through the mirror into a comparatively brighter observed space or room on an opposite side of the mirror from the viewing room. These one-way mirror panels are particularly formed to be partially reflective and partially transparent by tuning the optical properties of the panels including by changing a thickness, or a composition, of one or more reflecting layers in or on the panels. The glass of the panel may be, for example, coated with, or have embedded in it, a thin almost-transparent layer of a metallic material to produce a mirrored surface that reflects some light and that permits the rest of the light to be transmitted through the mirror. The optical "trick," however, is that the light always passes through the mirror exactly equally in both directions. Thus, the principle of operation is to keep one side brightly lit rendering that side "difficult" to see through based on the principle that the reflected light masks visual penetration of the mirror from the brightly lit side. While this may work in particular implementations, no one is fooled into believing that the observed mirrored panel is not provided for observation of the lit space from the other non-lit side. Also, the very effect that is intended, in that a substantial portion of the incident light is reflected back from the "lighted" side of the mirror, provides a substantially non-modifiable adverse transmissive property of the ambient light on the lighted side of the panel through the panel.

High-end vehicle window tinting adds an outer reflective layer that accomplishes an effect similar to a one-way mirror in that an adhesive-backed film is applied to an inner or outer surface of the vehicle windows to render them substantially one-way mirrors when observed from outside the vehicle. It becomes difficult then to see inside the vehicle from the outside unless and until an observer gets very close to the vehicle and shades a portion of the film layer. By doing so, the observer may be able to see through the vehicle window albeit that it may still be very heavily shaded, substantially defeating the purpose of the heavy tinting. Here too, the configuration of the substantially darkened tinting adversely affects a light transmissive property from, for example, an outside of the vehicle to an inside of the vehicle, which is necessarily darkened or shaded in a non-discriminant manner.

Recently, advertising schemes have emerged in which what is commercially described as a "View Through Vinyl" is applied to windows to provide what, at first observation, appears to be opaque signage, often in the form of a particular advertisement, formed on an office window, on a bus window, or on other like glass or transparent plastic surface that is selected for ease of application, and removal as necessary of the vinyl application. On close inspection, it is revealed that the vinyl application can be effectively "viewed-through" from the non-image side based on the applied vinyl film (generally having a printed image side and an adhesive-bearing non-image side) being perforated with pinholes that may be preferably in a range of 1.5 mm in diameter typically in 65/35 pattern in which 35% of the graphics on the printed side are removed to produce a fine mesh window covering. Such a perforation scheme leaves enough printed design on the observation side that the signage "appears" opaque. The perforation scheme, however, removes enough of the vinyl material from the film to provide see-through visibility from the non-printed or non-image side. Again here, however, the focus of these externally applied window treatments is to provide a preferred "look" to a particular window with little regard for any effect on the light transmissive properties of the window created by the externally applied coating. These schemes are further limited by necessarily requiring that particular dimensions of a window area to be covered are known, and the window area must be available for the view-through vinyl to be applied thereto.

Separately, there are certain manufactured fabrics that appear to be opaque to observation, but that allow for the transmission of particular wavelengths of electromagnetic energy, including visible light rays, or near-visible light rays. An example of such a fabric is Microsol® from which so-called tan-through swimwear and other garments are made. Descriptions of such material and their uses are found in, for example, U.S. Pat. No. 5,518,798 to Riedel (Issued May 21, 1996) describing a composition of a particular material that transmits sunlight, and to the swimwear and light-protective wear made from the material, and in U.K. Patent Application Publication No. 2 461 488 to Lanham-New (Published Mar. 8, 2011) directed to articles of headwear, and particularly articles of headwear that are required by certain religious practices to cover the head, forehead, face and/or eyes of the wearer, that are formed of a material that appears substantially opaque as observed, but the transmits sunlight in an effort to reduce, for example, a vitamin D deficiency in the wearer. These fabrics, however, will produce the same filtering effects regardless of which side of the fabric is illuminated. In this regard, the light is filtered through the fabric equally in either direction.

Remote sensors for discerning all manner of environmental factors and/or activities in a particularly-monitored area through the collection and analysis of electromagnetic energy elements present in the particularly-monitored area continue to gain broader proliferation and acceptance as new and unique employment scenarios emerge. In the fields of area observation, surveillance and monitoring, still and video cameras, and all manner of visual light, and near-visual light, reactive sensors are often employed. Depending on the nature of the area observation, surveillance or monitoring, it may be preferable to conceal or camouflage the presence of a particular camera or other electromagnetic energy sensor in order that such presence goes largely undetected to casual observers or intruders in the monitored areas. Other considerations include that it may simply be preferable to unobtrusively embed the cameras or sensors in a particular structure in a manner that does not adversely affect aesthetics of the structure. A difficulty is that conventional attempts to conceal, camouflage or otherwise hide the lenses of the cameras, or other image or energy receivers associated with particular sensors, generally indiscriminately and disadvantageously modify the characteristics of the electromagnetic energy passing through any concealing, camouflaging, or otherwise hiding layer. In a case of visual, or near-visual, light passing through the concealment of a camera or sensor devices, this modification of the characteristics of the energy passing through the layer can, and generally does, adversely affect the operation of such devices in a concealed operational employment scenario.

In the fields of energy collection and energy harvesting, photovoltaic cells, or other photocells, are often advantageously employed on or in a particular structure to convert ambient light to electricity. The efficiency of a particular photocell is affected by its capacity to absorb, and/or to minimize reflectance of, incident light on the surface of the photocell. For this reason, photocells are generally formed to have dark, normally black or dark grey, exposed light-facing or light-incident ("facial") surfaces. Maximum efficiency in operation of the photocell is achieved when the dark facial surface is exposed to unfiltered light in the visible, or near-visible, spectrum. It is for this reason that, in virtually all conventional installations, the photocells are mounted unmodified on an external surface of a structure either (1) fully exposed, or (2) exposed behind a clear glass, clear plastic or similar clear (substantially light transparent) protective outer structural layer that transmits the visual, or near-visual light, in an unmodified manner, to the facial surfaces of the photocells. The protection afforded by any protective outer structural layers is intended to be solely against adverse environmental effects and/or damage to the facial surface of the photocell without adversely affecting the full transmission of visible, or near-visible, light to the facial surface of the photocell. A significant drawback to the wider proliferation of photocells used in a number of potentially beneficial operating or employment scenarios then is that such "required" installations, in many instances, adversely affect the aesthetics of the structure or object on which the photocells are to be mounted for use.

Put another way, it is known that photocells typically must be visible, in an unimpeded, and/or unfiltered, manner to the surrounding ambient light. It is further known that the visual appearance of the photocells cannot be significantly altered from the dark presentation or composition provided by the facial surface without rendering the photocells significantly less efficient, or otherwise substantially degraded in their operation. Presence of photocells in a particular installation is, therefore, easily visually distinguishable. For this reason alone, inclusion of photocells in particular installations, or in association with certain structures, objects or products are often avoided. Manufacturers generally make these decisions based on the photocells, when installed, becoming visual detractors or distractors to the appearance or ornamental design of the structures, objects or products on which photocells may be otherwise advantageously applied and employed.

SUMMARY

The above discussion centers on applications of known technologies for providing surface treatments and coverings that, in particular circumstances, effectively "trick" the human eye into seeing a generally opaque presentation from a viewing, observation or light incident side while providing some graduated level of filtered transmission of visual light, or near-visual light, through the surface treatments and coverings in a manner that allows certain, but not all, of the RF energy to penetrate the surface treatments and coverings. Although the above discussion is centered on visual optics, the principles according to this disclosure may be equally applicable to filtering of wavelengths electromagnetic energy lying well outside the visual spectrum. To date, however, the particular implementations discussed above, and other like implementations, are all constrained in their ability to be more-broadly adapted to a greater range of use cases based on their inherent limitations, the particular manufacturing processes by which objects including these particularized capabilities are formed, and certain attendant drawbacks in their use, particularly with regard to the manner in which the electromagnetic energy, including light in the visible and near-visible spectrum, is limited, filtered, occluded or otherwise modified as it passes from an energy- or light-incident side to an opposite side of the particular structure, structural component structural outer layer.

In view of the above-identified limitations with regard to the applications of known one-way energy transmissive schemes, techniques and/or materials, it would be advantageous to develop advanced light scattering layers, and 3D object or object outer layer forming systems and/or processes that provide particularly-adapted structures and light scattering layers that appear "opaque" from an outer, viewing, observation or energy/light-incident side, but that otherwise provide a substantially un-filtered energy/light transmissive property rendering the thus-formed layers, objects and/or object outer layers substantially energy/light transparent, as viewed from an inside of the formed object or from an opposite or non-energy/light-incident side of the formed structural or outer layer.

Exemplary embodiments of the systems and methods according to this disclosure may provide techniques, processes and schemes by which to form, or otherwise incorporate, one or more one-way light transmissive, or substantially transparent, object portions, layers, lenses, filters, screens or the like in solid objects and/or manufactured systems or components of systems that are formed or manufactured to myriad beneficial purposes.

Exemplary embodiments may form individual energy scattering layers out of substantially-transparent micrometer and sub-micrometer spheres, including micro-particles and/or nano-particles, which may have micro- and/or nano-voids incorporated between them. In embodiments, refractive indices of the individual particles, or the matrices in which the particles are fixed, may be tunable in order that the finished layers provide a selectively-opaque appearance when viewed (or exposed to incident energy) from an energy/light incident side. In embodiments involving scattering of light in the visual range, a selectively-opaque appearance may be rendered according to an individual user's desires, while the scattering layers are substantially-transparent to other wavelengths of energy/light passing through the finished layers to areas or sensors behind those finished layers.

In embodiments, because the energy/light scattering layers are comprised of substantially-transparent components (particles and fixing matrices), there is virtually no restriction on a particular environment, or to a particular use, in which the layers and/or objects formed of the layers maybe operatively deployed for use.

Exemplary embodiments may form solid or hollow object body structures, or otherwise object outer layers, consisting of substantially-transparent micrometer and sub-micrometer spheres or particles arranged in matrices with micro- or nano-voids provided therebetween to render layers that appear energy opaque from a viewing, observation or energy/light incident side, with object body portions, object outer layers, or selective discrete portions of the object outer layers being substantially-energy/light transparent, when viewed from the non-viewing or non-energy/light incident side, or from an internal portion of the solid object body structure, inside the hollow object body structure, or from a side of an object outer layer opposite to the viewing, observation or light incident side.

Exemplary embodiments may form the solid object body structures, shells of the hollow object body structures or otherwise object outer layers from micro-particles, nano-particles, micro/nano voids (as may be produced by microspheres or an evaporation process), or combinations of the above to present an opaque appearance according to a particular desired color through manipulation of the constituent properties of the substantially-transparent micro-particles, nano-particles and the like in a manner that "tunes" the wavelengths of the reflected or "scattered" light.

In embodiments, the micrometer and sub-micrometer spheres or particles, may be comprised of, for example, titanium dioxide in order to take advantage of a high index of refraction and comparatively low cost based on the availability of such a substance in the surface coating and/or paint manufacturing industries.

In embodiments, refractive indices of the energy scattering layers may be particularly tuned according to sizes of the micrometer and sub-micrometer spheres, compositions of materials from which the micrometer and sub-micrometer spheres may be formed, compositions of materials forming the matrices in which they micrometer and sub-micrometer spheres are dispersed and fixed, and sizes of interstitial spaces (voids) provided between micrometer and sub-micrometer spheres.

Exemplary embodiments may provide light scattering layers disposed on, or as constituent components of, solid object body structures, hollow object body structures or otherwise as object outer layers in which the light scattering layers allow wavelengths of light to pass through the light scattering layers, while scattering determined wavelengths of the light to produce a desired visual appearance in the light scattering layers when viewed from a viewing, observation or light-incident side.

In embodiments, the light scattering layer may be formed in a manner that scatters the same wavelength of light across an entirety of the particular light scattering layer whether included for full coverage of an outer surface of an object or only at discrete portions of an outer surface of an object. In such embodiments, sphere or particle sizes, and material compositions of the spheres or particles, and the matrix within which the spheres or particles are fixed, may be substantially homogenous across an expanse of the light scattering layer.

In embodiments, the light scattering layer may be formed in a manner that scatters determined wavelengths of light within discrete areas of the light scattering layer in order that, rather than reflecting a single color, the light scattering layer may reflect multiple colors, and even patterned, texturized, and/or multi-color images. In such embodiments, differing refractive indices are presented across an expanse of the light scattering layer by varying sphere or particle sizes, and/or material compositions of the spheres and/or particles and the matrix within which the spheres and/or particles are fixed. In other words, a composition of the light scattering layer will be substantially non-homogenous.

In embodiments, the energy/light scattering layers may be formed using substantially-transparent metal nanoparticles embedded in dielectric matrices.

In embodiments, the energy/light scattering layers may be formed according to processes that uniquely adapt 2D image forming techniques, including photographic emulsion image forming techniques, for light scattering layer forming, and that further uniquely adapt 3D additive manufacturing ("AM"), printing and/or laminating techniques for forming 3D objects comprising such energy/light scattering layers in whole, or in part.

In embodiments, the light scattering layers may be formed by applying, for example, a photographic grade silver halide gel to a surface of an object and using a chromoskedasic development process to form and fix the light scattering properties of the layer to a particular color or image presentation.

In embodiments, a surface, or surface layer, that appears opaque when viewed from the viewing, observation or light incident side may be formed to appear formed of a material of a particular color, or to include a particular pattern, including a multi-color pattern, at the discretion of the user forming the object or object layer.

Exemplary embodiments may form solid object body structures, or object outer layers, that may be used to facilitate transmissivity of light in one direction in order to promote lighting of an area shaded by structures otherwise formed of conventional materials. By way of non-limiting example, these normally-shaded areas may include the volume of area underlying an elevated porch, or other like normally disadvantageously shaded area.

Exemplary embodiments may form solid object body structures, or object outer layers, that may house or cover all manner of light-activated, light-absorbing, light-employing, or otherwise operationally light-involved sensors including, but not limited to, cameras, lights sensors, photovoltaic cells/photocells and the like.

In embodiments, an appearance of embedded photovoltaic cells or photocells may be enhanced by a coating or film that is particularly arranged to allow an appearance of the photovoltaic cells or photocells to be masked behind the layer presenting one or more of a wide range of chosen colors and/or chosen patterns in a manner that does not substantially disrupt or degrade an efficient operation of the photovoltaic cells and/or photocells.

In embodiments, application of such an overlayer for a photovoltaic cell and/or photocell may address shortfalls in broader use of photovoltaic cells and/or photocells based on their recognized fragility and limitations on sufficient structural areas that may be readily exposed to light available on the surfaces of certain objects.

In embodiments, substantially an entire outer surface of a particular object may be made transparent to embedded arrays of photovoltaic cells and/or photocells, thereby increasing the potential available energy collection or energy harvesting capacity of the particular object without adversely affecting a required aesthetically consistent, or optionally aesthetically pleasing, outer presentation of the particular object.

Exemplary embodiments may provide particularly formed protective outer layers that (1) allow for the transmission of energy/light substantially unmodified therethrough in support of the embedded photocells or other sensors, and (2) allow for reflection of selected wavelengths of light thus creating highly-adaptable surface finishes. As indicated above, these highly-adaptable surface finishes may generally be configured to appear as any particular user-selected color or according to any prescribed (and/or user-selected) pattern, including a multi-color pattern, or a multi-color image. In this manner, exemplary embodiments may provide objects formed of, or including as an outer layer, a surface light scattering layer that allows the visual appearance of embedded components to be masked behind an object surface that can appear to an observer to have a predetermined surface color or a predetermined surface color pattern, or to be comprised of a predetermined surface image.

Exemplary embodiments may form wall plates of typical residential and/or commercial configurations as the solid object body structures including light scattering layers for covering typical electrical switch, outlet and other residential and commercial installations. In embodiments, underlying switch boxes and/or outlet boxes may be configured to include energy- and/or light-activated sensors, devices, power generation components or the like. Provision of a wall plate according to the disclosed embodiments may facilitate energy transmission through the wall plate, having an opaque appearance, to the underlying sensors, devices or components. In embodiments, such sensors, devices or components may be affixed to the box side (non-light-incident side) of the wall plates.

Exemplary embodiments may provide object body structures that may include additional separately-formed, partially-transmissive and selectively-reflective layers. The partially-transmissive and selectively-reflective layers may, for example, comprise directionally-transparent layers which may be formed with or without perforations. In embodiments in which perforations may be included, the perforations may be substantially equal in size to a determined wavelength of light. In embodiments, the perforations may be in a form of interstices and/or voids between the micrometer or sub-micrometer spheres comprising the light scattering layer. In embodiments, the perforations may be in a form of openings in the matrix material in which the micrometer or sub-micrometer spheres are fixed.

Exemplary embodiments may form object body structures that include additional layers that constitute light focusing/redirecting layers, optical isolator layers, mirrored surface layers, or the like.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for forming electromagnetic energy transmissive layers, which are particularly formed to selectively scatter specific wavelengths of electromagnetic energy while allowing remaining wavelengths to pass therethrough, including by uniquely employing optical light scattering techniques of substantially-transparent micrometer or sub-micrometer spheres in those layers, and to objects, object portions, wall plates, lenses, filters, screens and the like that are formed of, or otherwise incorporate, such transmissive energy scattering layers, will be described, in detail, with reference to the following drawings, in which:

FIG. 6 illustrates an exemplary embodiment of a detail of an energy/light scattering layer according to this disclosure;

DETAILED DESCRIPTION OF EMBODIMENTS

Figure 1:
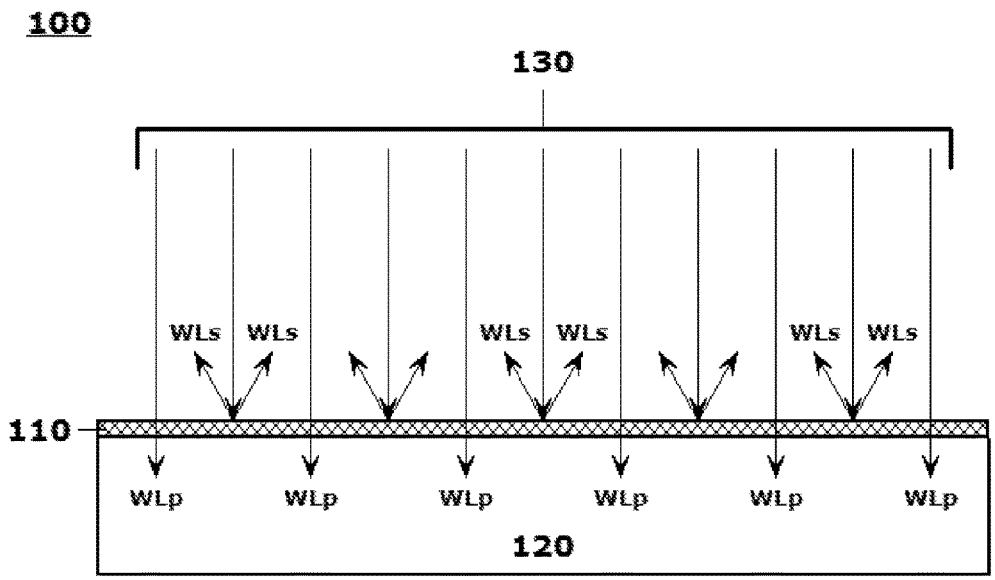
FIG. 1 illustrates a schematic diagram of an exemplary object energy/light scattering surface layer disposed on a transparent portion of a 3D body structure according to this disclosure.

The systems and methods according to this disclosure include techniques for forming electromagnetic energy transmissive and/or scattering layers. These layers may be particularly formed to selectively scatter particular wavelengths of electromagnetic energy, including light energy in the visual, near-visual or non-visual range, while allowing remaining wavelengths to pass therethrough. These layers may uniquely employ optical light scattering techniques in such energy-scattering layers comprised of substantially-transparent micrometer or sub-micrometer spheres in those layers. The disclosed systems and methods may further include techniques for forming objects, object portions, wall plates, lenses, filters, screens and the like that include, or otherwise incorporate, such transmissive energy scattering layers and/or light scattering layers. Descriptions of the disclosed systems and methods will refer to a range of real world use cases and applications for 2D energy/light scattering layers, and/or for 3D objects incorporating one or more 2D energy/light scattering layers, that are so formed.

Exemplary embodiments described and depicted in this disclosure should not be interpreted as being specifically limited to any particular configuration of: (1) a structure, object, object portion, article of manufacture or component section thereof; (2) particular individual materials for forming the described energy/light scattering, light directing or light transmissive layers, including but not limited to any particular composition of the micrometer or sub-micrometer spheres, including micro-particles and/or nano-particles, and any interstitial voids or nano-voids established between such micrometer or sub-micrometer spheres, in any layer forming process; or (3) any particular class of energy/light collecting sensor components that may be operationally mounted in, installed in or placed behind such energy/light scattering, light directing or light transmissive layers so as to be hidden from view when an object including such sensor components is viewed from a viewing, observation or light incident outer surface of the object or layer, from which perspective the energy/light scattering, light directing or light transmissive layers may appear "opaque" to the incident electromagnetic energy. It should be recognized that any advantageous use of the disclosed schemes for forming energy/light transmissive, light directing and/or light scattering layers, and objects formed of, or otherwise incorporating, such layers to effect an aesthetically consistent, or aesthetically pleasing, outward appearance of the object or layer while allowing particularly visible, or near-visible, light components to pass through employing systems, methods, techniques, processes and/or schemes such as those discussed in detail in this disclosure is contemplated as being included within the scope of the disclosed exemplary systems and methods.

The disclosed systems and methods will be described as being particularly adaptable to hiding certain photovoltaic cells or photocells (generally referred to below collectively as "photocells") within objects or behind layers that may appear opaque from a viewing, observation or light incident side. As used throughout the balance of this disclosure, the term "photocell" is intended to reference, without limitation, a broad class of light-activated, light-absorbing, light-employing, or otherwise operationally light-involved sensors, sensor components or devices in which a photoelectric, photoconductive or photovoltaic effect is advantageously employed to produce a current or voltage when exposed to light (in a visual or near-visual range of the electromagnetic spectrum), or other selected electromagnetic radiation. Those of skill in the art recognize that such photocells may be alternatively referred to as photoelectric cells, photovoltaic cells, or photoconductive cells, and more colloquially is certain implementations as "electric eyes." The generic use of the term photocell in this disclosure encompasses, without limitation, these terms.

Photocells are covered in silica crystalline, amorphous, thin-film, organic or other light directing layers. These light directing layers work by implementing scattering and/or plasmonic effects in which light absorption is improved generally by scattering light using metal nanoparticles excited at a surface plasmon resonance of those nanoparticles. Surface plasmon resonance or SPR generally refers to a resonant oscillation of conduction electrons at an interface between a negative and positive permittivity material when stimulated by incident light. A resonance condition is established when the frequency of incident photons matches a natural frequency of surface electrons oscillating against a restoring force of positive nuclei.

In embodiments of the systems and methods according to this disclosure, unique and advantageous light directing layers scatter a small portion of an impinging light spectrum back in a direction of an observer on a viewing, observation or light incident side of the light directing layer. In this manner, a particular light directing layer may appear to have a particular color in the visual spectrum, while a substantial portion of the light energy permissibly passes through the thin light directing layer impinging on an operative surface of the underlying photocell to produce electricity according to the photoelectric effect.

Reference may be made to the disclosed energy/light transmissive layers, energy/light scattering layers and/or energy/light directing layers, as these terms may be interchangeably used in the context of this disclosure, being particularly usable to aesthetically hide photocells. It should be recognized, however, that the disclosed layers may be equally effective in employment scenarios, and/or use cases in which other sensors including some form of camera or imaging device or lens positioned behind such a layer may be usable for observation of a space or area. A capacity of such a camera or imaging device to be usable in substantially all lighting conditions may be limited only by a capability of the camera or imaging device itself, and not limited based on any failure of the light scattering layer behind which the camera or imaging device is placed to be substantially-transparent with respect to the camera or imaging device. A position of such a camera or imaging device behind the light scattering layer may be substantially "hidden," or otherwise camouflaged, as may, in like manner, be a position of any number of light actuated detection, sensor or other device components. In this regard, general reference to the use of the disclosed that energy/light scattering layers, or objects formed of those energy/light scattering layers, as embedding photocells should not be considered as limiting the disclosed systems and methods to any particular set or class of light-activated or light employing sensors. Further, while general reference will be made to "light scattering" effects, these references are not intended to exclude energy scattering in other portions of the electromagnetic spectrum to which certain energy scattering layers may be made to appear opaque to particular wavelengths of non-visible radiation.

Additionally, reference to any particularly useful compositions of the materials from which the disclosed micrometer or sub-micrometer spheres, micro-particles and/or nano-particles may be formed are also descriptive only of broad classes of input materials that may be presentable in generally transparent, or seemingly transparent, micrometer or sub-micrometer sphere, micro-particle and/or nano-particle form. Suitable materials for such micrometer or sub-micrometer spheres, micro-particles and/or nano-particles may be discussed specifically according to their composition, or may be more broadly referred to by certain functional parameters (including variable refractive indices), neither of which should be considered to limit the broad scope of available input materials of which such micrometer or sub-micrometer spheres, micro-particles and/or nano-particles may be formed. Typical sphere or particle sizes will be in a range of 25 microns or less, generally depending on wavelengths of the incident energy that are intended to be scattered by the energy scattering layer. Additionally, typical dielectric matrices in which such micrometer or sub-micrometer spheres, micro-particles and/or nano-particles may be stabilized will be described. Again here, any reference to a particular transparent dielectric material to promote the stabilization or fixing of particular micrometer or sub-micrometer spheres, micro-particles and/or nano-particles in layer form are intended to be illustrative and non-limiting.

Exemplary embodiments may advantageously employ an energy/light directing, energy/light reflecting and/or energy/light scattering layer that covers at least a portion of an outer surface of a particular 3D object, including such 3D object as may be formed in any molding, machining, or AM object forming process. The energy/light directing, energy/light reflecting and/or energy/light scattering layer may be usable to scatter at least a portion of the impinging energy and/or light spectrum back to an observer. In a case in which visible light, for example, is scattered back to an observer, the object may give an appearance of having a particular color, or a particular pattern, or including a particular image on an outer surface of the finished object.

Apparent colors, patterns or images of light scattering layers may be produced by adjusting refractive indices of the particles according to a size of the particles, a material composition of the particles, a physical (layered) composition of the particles, a composition of a matrix material in which the particles may be fixed, a presence and size of interstitial voids between the particles, a multiplicity of individual particle/matrix layers or any combination of the above. Apparent solid colors may be produced by presenting a substantially homogenous combination of the above parameters across a light incident surface of the light scattering layer. Patterns may be produced by appropriately varying the adjustment of the refractive indices by manipulating one or more of the above parameters across the light incident surface of the light scattering layer.

In embodiments, an object, outer surface coating for an object, and/or outer film may be provided that is designed to allow a wide range of chosen colors to be presented to an observer from a viewing, observation or light-incident side of the object while substantially maintaining an efficiency of any embedded sensor or photocell as though covered by any essentially clear, light transparent covering, coating or protective outer layer.

In embodiments, virtually any object surface may be modified such that photocells or other sensors associated with the object surface may be completely masked or camouflaged. A roof of a structure, for example, including a commercial building or a residential home, may be covered by photocells, but still have an appearance of a typical shingled, metal, tarred or other surface-treated roof. Separately, a portion of a wall of a structure, internal or external, could be embedded with photocells, while maintaining an appearance of a painted surface, a textured surface, or even a representation of a particularly-chosen piece of artwork. Vehicles, including automobiles and/or buses, may be provided with photocells on various outer surfaces, the photocells being masked by overcoats of the light directing and/or light scattering layers so as to render the affected surfaces as appearing to consist of nothing more than normal, painted surfaces.

Outer surface layers of structures, vehicles or objects may incorporate a plurality of different sensors that are masked or camouflaged so as to be visibly undetectable, or in a manner that is aesthetically correct, pleasing or required according to restrictions in an operating environment or use case. In this regard, a required or desired appearance of an outer layer of a structure or structural component may be preserved in, for example, renovation of a structure which is subject to historic preservation or other outward appearance (or of appearance-modifying) restrictions, while providing advantageous use of a light transmissive property of an object or object surface layer to promote illumination of an area behind, beyond, under, or around the object or object surface that maintains the outward required or desired appearance.

Solid object body structures, hollow object body structures, or other object surface layers may be produced that are colorizable or visually texturizable without the use of pigments, paints, inks or other surface treatments that merely absorb certain wavelengths of light. The disclosed energy/light scattering layers allow determined visible, near-visible or non-visible wavelengths of energy/light to pass through the layers substantially unimpeded, while scattering other determined visible, near-visible or non-visible wavelengths of energy/light thus, in the case of visible light scattering, for example, producing a colorized look to the surface of the objects that include or incorporate the energy/light scattering layers.

FIG. 1 illustrates a schematic diagram 100 of an exemplary object energy/light scattering surface layer 110 disposed on a transparent portion of a 3D body structure 120. As shown in FIG. 1, the energy/light scattering layer 110 is configured to allow first determined wavelengths of energy/light, $WL_p$, to pass through the energy/light scattering layer 110. The configuration of the energy/light scattering layer 110 simultaneously causes certain second determined wavelengths of energy/light, WLs, to be scattered back in an incident direction substantially as shown.

As is noted above, and as will be described in greater detail below, the energy/light scattering layer 110 may be configured of substantially-transparent particles in a form of micrometer or sub-micrometer spheres of varying sizes, substantially in a range of 25 microns or less, including micro-particles, nano-particles, and interstitial or nano voids between the substantially-transparent particles. The substantially-transparent particles may be stabilized in structural or other layers further comprised of substantially-transparent matrix materials including, but not limited to, dielectric materials. An ability to configure the substantially-transparent particles to "tune" the light scattering surface of the light scattering layer 110 to scatter particular second determined wavelengths of energy/light, WLs, may provide the capacity of the energy/light scattering layer 110 to produce a desired visual appearance in a single color, multiple colors, or according to an image-wise visual presentation provided by the energy/light scattering layer 110. Put another way, depending on a particular composition of the components comprising the energy/light scattering layer 110 (or multiple layers), one or more colors, textures, color patterns, or color-patterned images may be visually produced by the energy/light scattering layer 110.

In cases where the incident energy includes wavelengths in the visual spectrum, refractive indices of the energy/light scattering layer 110 may be selectively tuned based on one or more sizes of the particles, one or more material compositions of the particles, one or more physical compositions of the particles, one or more material compositions of any matrix within which the particles may be fixed, interstitial openings or voids between the particles fixed in the matrix, or any combination of the above parameters. In embodiments in which the energy/light scattering layer 110 is intended to appear as a single color across a surface of the energy/light scattering layer 110, the composition of the particle/matrix/void scheme across the surface of the energy/light scattering layer 110 maybe substantially identical, or homogenous. In embodiments in which the light scattering layer 110 is intended to appear in multiple colors, multiple textures, or as an imaged surface, the composition of the particle/matrix/void scheme across the surface of the energy/light scattering layer 110 to present surface layer portions with differing refractive indices thereby appearing as different colors when viewed from a light-incident side of the energy/light scattering layer 110.

A light scattering effect of the energy/light scattering layer 110 may be produced in response to illumination generally from ambient light in a vicinity of, and/or impinging on, the surface of the energy/light scattering layer 110. Alternatively, the light scattering effect of the energy/light scattering layer 110 may be produced in response to direct illumination generally produced by some directed light source 130 focusing illumination on the light-incident surface of the energy/light scattering layer 110.

In the general configuration shown in FIG. 1, the energy/light scattering layer 110 is formed over the transparent 3D body structure 120 in a manner that allows the first determined wavelengths of energy/light, WLp, to pass not only through the energy/light scattering layer 110, but also to pass further through the transparent 3D body structure 120 in a substantially unfiltered manner that, in a case of light in a visual range, allows an area or light-activated sensor positioned in, under, or behind the transparent 3D body structure 120, or behind the energy/light scattering layer 110 and, for example, embedded in the transparent 3D body structure 120, to be illuminated by the first determined wavelengths of energy/light, WLp, in a manner as though those first determined wavelengths of energy/light, WLp, may have been otherwise caused to pass substantially unfiltered through a glass, plastic, or other transparent outer covering or protective layer. In this manner, the first determined wavelengths of energy/light, WLp, passing through the energy/light scattering layer 110, and the transparent 3D body structure 120, may provide significant light energy to simply illuminate an area shadowed by the transparent 3D body structure 120, or to be employed as appropriate by any manner of light detection component, including any light-activated, light-absorbing, light-employing, or otherwise operationally light-involved sensor positioned in or behind all or a portion of the transparent 3D body structure 120.

Figure 2:
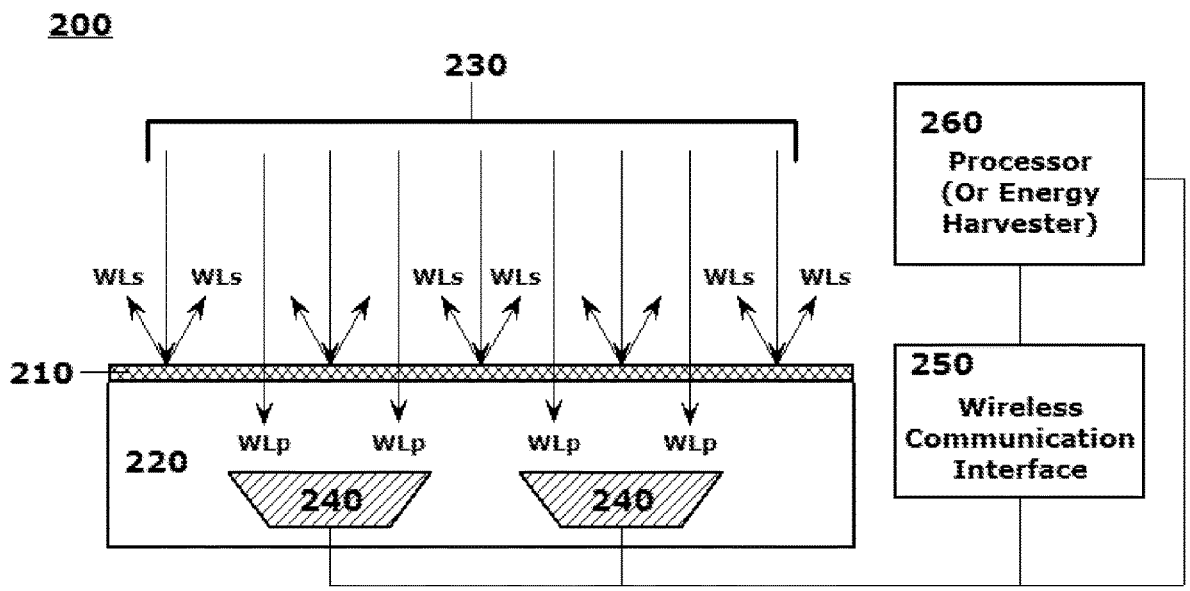
FIG. 2 illustrates a schematic diagram of exemplary light sensitive sensor elements embedded in a 3D object having a surface constituted, at least in part, of a light scattering surface layer according to this disclosure.

FIG. 2 illustrates a schematic diagram 200 of exemplary light sensitive sensor elements 240 embedded in a transparent 3D object body structure 220 of a 3D object having a surface constituted, at least in part, of a light scattering surface layer 210. As shown in FIG. 2, at least first determined wavelengths, WLp, of the ambient light in a vicinity of the light scattering layer 210, or of light directed from a light source 230 at the light scattering layer 210, may pass through the light scattering layer 210, in the manner described above with reference to the embodiment shown in FIG. 1, while at least second determined wavelengths, WLs, of the ambient light, or the directed light, may be scattered back in the incident direction in the manner described above. The at least the first wavelengths, WLp, of the ambient light, or the directed light, may be caused to impinge on a facing or facial surface of the exemplary light sensitive sensor elements 240.

In embodiments, the light scattering layer 210 may be disposed directly on the facial surface of the exemplary light sensitive sensor elements 240. At least the first wavelengths, WLp, of the ambient light, or the directed light, may cause the exemplary light sensitive sensor elements 240 to generate a particular output signal, which may be output to a processor (or energy harvester) 260 with which the exemplary light sensitive sensor elements 240 may be in wired or wireless communications. Wireless communications may be conducted between the exemplary light sensitive sensor elements 240 and the processor (or energy harvester) 260 directly or via an intervening, or associated, wireless communication interface 250. Such wireless communication interface 250 may operate according to any compatible wireless signal processing protocol including, but not limited to, Wi-Fi, WiGig, Bluetooth®, Bluetooth Low Energy (LE)® (also referred to as Bluetooth Smart® or Version 4.0+ of the Bluetooth® specification), ZigBee®, or other similar wireless signal processing protocol.

In an embodiment in which the exemplary light sensitive sensor elements 240 may comprise photocells, the at least the first wavelengths of light, WLp, may provide sufficient light energy to activate the photocells in a manner that converts the at least the first wavelengths of light, WLp, to electricity to be collected by the energy harvester or other electrical energy storage element, or to be transmitted via electrical energy transmission means to an associated load.

Although depicted as discrete elements for ease of illustration and understanding, the exemplary light sensitive sensor elements 240, particularly when presented as photocells, may comprise a substantially integrated, and/or unitary, photocell array embedded in, or placed behind, a transparent 3D body structure 220, or otherwise replacing substantial portions of the transparent 3D body structure 220, by having the light scattering layer 210 disposed directly on the photocell array.

Figure 3:
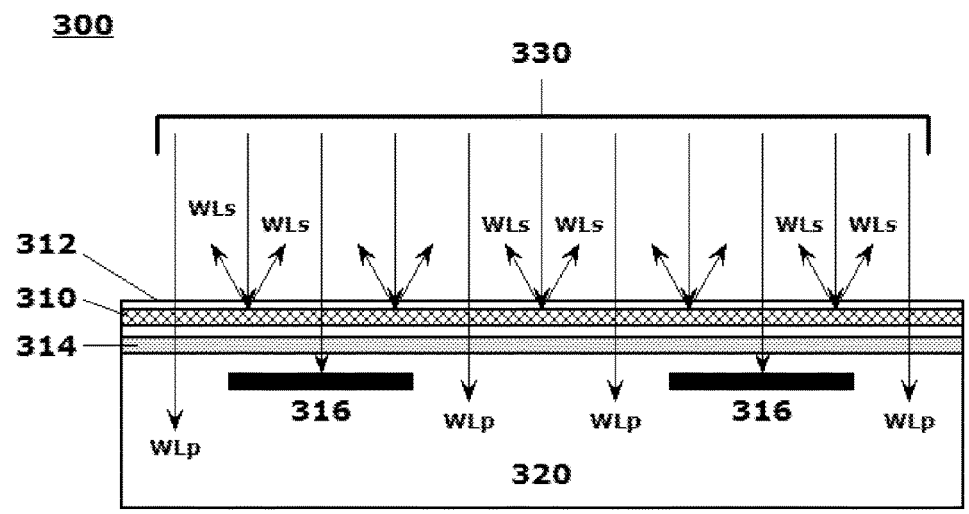
FIG. 3 illustrates a schematic diagram of an exemplary 3D object laminated surface including, as one or more of the laminate layers, an energy/light scattering layer according to this disclosure.

FIG. 3 illustrates a schematic diagram 300 of an exemplary 3D object laminated surface including as one or more of the laminate layers an energy/light scattering surface layer 310. As shown in FIG. 3, the ambient energy/light in a vicinity of the energy/light scattering layer 310, or the energy/light directed from an energy/light source 330 at the energy/light scattering layer 310, may pass through a clear overlayer 312, which may be in the form of a clear protective layer. The clear overlayer 312 may be formed of a glass, a plastic, an other energy/light transparent composition, and/or of a material from which the transparent 3D body structure is substantially formed. The energy/light scattering layer 310 may be configured to operate in a same manner as the energy/light scattering layer described above with reference to FIG. 1. At least first wavelengths of energy/light, WLp, may pass through the energy/light scattering layer 310, while at least the second wavelengths of energy/light, WLs, may be scattered back in the incident direction in the manner described above.

The at least first wavelengths of energy/light, WLp, may be focused or filtered through one or more laminate layers configured as energy/light focusing/filtering layers (or elements) 314. The energy/light focusing/filtering layers may be in a form of optical isolators, prisms, lenses or the like, and may focus, filter or otherwise condition the first wavelengths of energy/light, WLp, as may be appropriate to control the exposure of the underlying area to the first wavelengths of energy/light, WLp, or as may be required to make the first wavelengths of energy/light, WLp, compatible with the capabilities, or input requirements, of one or more underlying, or embedded, sensors, including cameras and/or other imaging devices. Those of skill in the art will recognize that the first wavelengths of energy/light, WLp, may require minor modification and/or re-filtering to be rendered compatible.

The first wavelengths of energy/light, WLp, may also or otherwise be partially blocked from further transmission to and through the transparent 3D body structure 320 by one or more opaque, near opaque, or darkened energy/light shades 316, which may be in a form of solid object body components. The energy/light shades 316 may substantially shield or shadow portions of the transparent 3D body structure 320, and any area or sensor placed behind the energy/light scattering layer 310 in or behind the transparent 3D body structure 320 from exposure to the first wavelengths of energy/light, WLp. The energy/light filtering layers (or elements) 314 and the energy/light shades 316 may be arranged in any configuration to function exclusively, or otherwise to function cooperatively, to control and/or otherwise direct the transmission of the first wavelengths of energy/light, WLp, through the transparent 3D body structure 320 to an area or sensor, for example, behind the 3D body structure 320.

Figure 4:
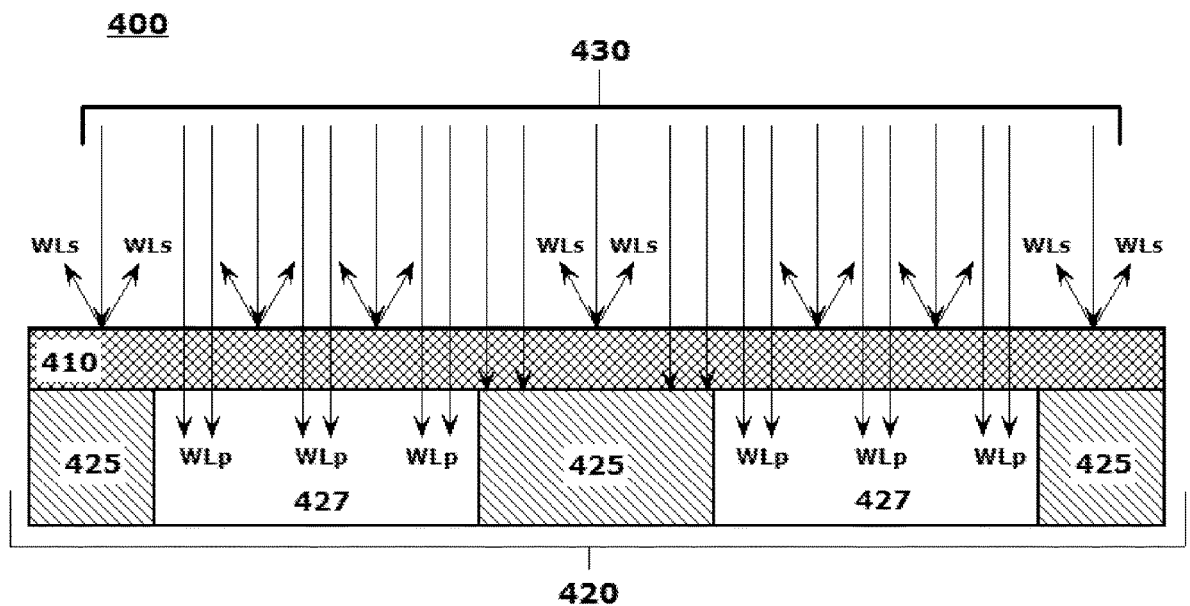
FIG. 4 illustrates a schematic diagram of an exemplary 3D object having at least one portal portion including an energy/light scattering surface layer according to this disclosure.

FIG. 4 illustrates a schematic diagram 400 of an exemplary 3D object having at least one portal portion 427 including an energy/light scattering surface layer 410 in a 3D body structure 420. As shown in FIG. 4, the energy/light scattering surface layer 410 may be configured to operate in a same manner as the energy/light scattering layer described above with reference to FIG. 1. At least first wavelengths, WLp, of the ambient energy/light, or the directed energy/light emanating from the energy/light source 430, may pass through the energy/light scattering layer 410, while at least second wavelengths, WLs, of the ambient energy/light, or the directed energy/light, may be scattered back in the incident direction, in the manner described above.

A difference in the configuration shown in FIG. 4 is that the 3D body structure 420 is not completely transparent. The 3D body structure 420 includes transparent portal portions 427 and non-transparent blocking portions 425 so that the first wavelengths of energy/light, WLp, may be channeled through the portal portions 427 in a manner that discretely controls the exposure of the underlying area to the first wavelengths of energy/light, WLp, or discretely controls the exposure of one or more underlying, or embedded, sensors that may be arranged in, or in line with, the transparent portal portions 427.

Consider an embodiment in which the 3D body structure 420 may take a form of a structural building component such as, for example, deck planking. At least a portion of the deck planking may include portal portions 427 underlying an energy/light scattering layer 410 to provide exposure or illumination by light energy of an area shadowed by a raised deck constructed of one or more units of such deck planking. The configuration of the energy/light scattering layer 410 may present a same visual appearance as solid portions of the deck planking, or other adjacent conventional deck planking that is not configured to have such energy/light scattering layer 410 portions. In this manner, an aesthetically uniform appearance may be provided for a deck surface while pockets of light illumination may be provided to expose the normally disadvantageously shaded area underlying the deck to light energy.

Figure 5A:
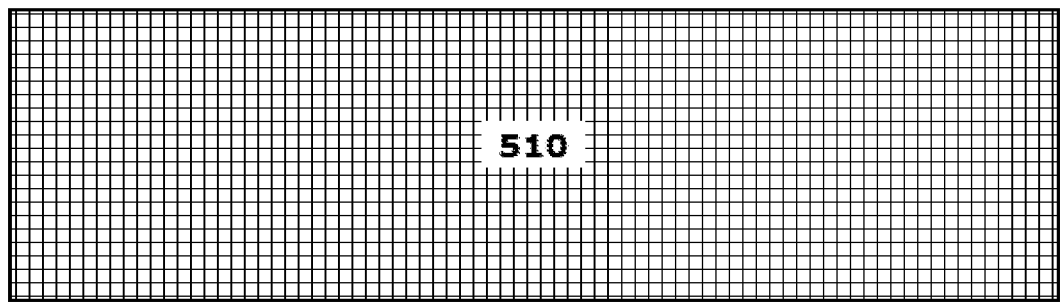
FIGS. 5A-5C illustrate exemplary depictions of light scattering surface layers according to this disclosure viewed in plan form from a viewing, observation or light-incident side.
Figure 5B:
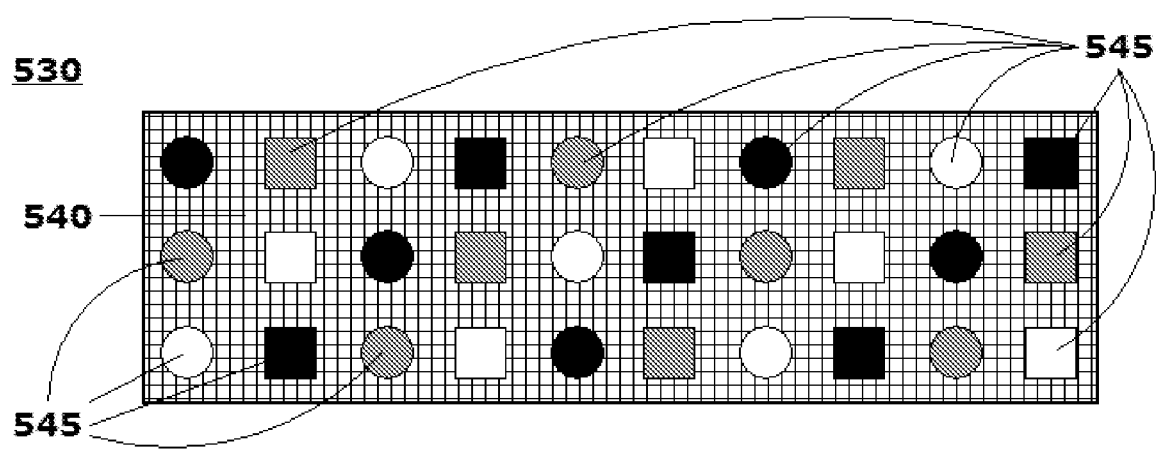
Figure 5C:
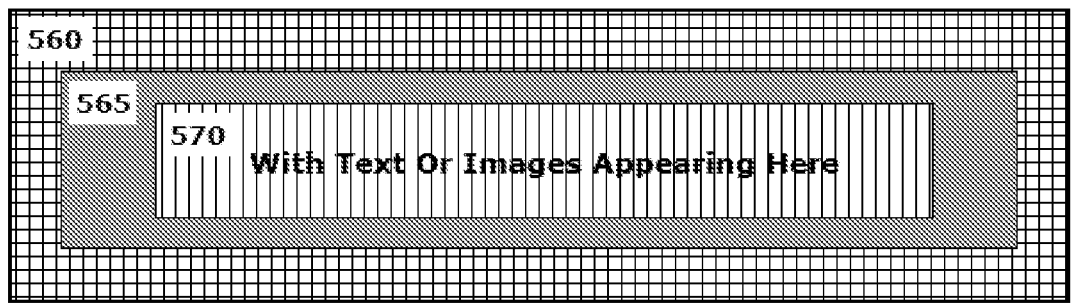

FIGS. 5A-5C illustrate exemplary depictions of light scattering surface layers according to this disclosure viewed in plan form from a viewing, observation or light-incident side. As shown in FIG. 5A, the exemplary embodiment 500 includes a light scattering surface layer that is formed to scatter a same wavelength of light, WLs, across an entire light scattering surface layer thus producing a single visible color 510. As shown in FIG. 5B, the exemplary embodiment 530 includes a light scattering surface layer that is formed so as to scatter a first wavelength of light, $WLs_1$, as a background color 540, and a plurality of second wavelengths of light, $WLs_n$, as other color/texture portions 545. The plurality of second wavelengths of light, $WLs_n$, producing color/texture portions 545 may be formed in the light scattering surface layer and configured to scatter one or more second determined wavelengths of light, $WLs_n$, only within determined areas of the light scattering surface layer to thus produce some manner of a multi-color and/or textured appearance in the light scattering surface layer. As shown in FIG. 5C, the exemplary embodiment 550 includes a light scattering surface layer that is formed so as to scatter a first wavelength of light, $WLs_1$, as a first background color 560, a second (or more) wavelengths of light, $WLs_2$, as second intermediate background color(s) 565, and a plurality of third wavelengths of light, $WLs_n$, as color/texture/image portions 570. The plurality of third wavelengths of light, $WLs_n$, as the color/texture/image portions 570 may be formed in the light scattering surface layer and configured to scatter one or more third determined wavelengths of light, $WLs_n$, within determined areas of the light scattering surface layer to thus produce some manner of a multi-color, multi-texture and/or image-wise appearance in the light scattering surface layer.

In all of the embodiments described above, it should be appreciated that the various light scattering layers may be formed in a manner to allow the first determined wavelengths of light, WLp, to pass through the light scattering layers as selected wavelengths in a visible, near-visible or non-visible range, and to allow the second determined wavelengths of light, $WLs_{(x)}$, to be scattered as selected wavelengths primarily in the visible range. The single color, multi-color, multi-textured or image-wise visual presentations may result from localized tuning of refractive indices of the light scattering layers according to the variations in the particular parameters regarding compositions of the particles, the matrices, and voids substantially in the manner described above.

FIG. 6 illustrates an exemplary embodiment of a detail of an energy/light scattering layer 600 according to this disclosure. The disclosed schemes, processes, techniques or methods may produce an energy/light scattering layer 600 created using substantially-transparent micrometer or sub-micrometer spheres in a range of diameters of 25 microns or less and in a form of metal nano-particles 620 embedded in a substantially-transparent dielectric matrix 610. As an example, the metal nano-particles 620 may include titanium dioxide nano-particles. It is well known that titanium dioxide is widely used as a white pigment based on its brightness and comparatively high refractive index. Titanium dioxide is, for example, found in a substantial number of physical sunscreens based on this property as well as its strong ultraviolet (UV) light absorbing capabilities, and general resistance to discoloration under exposure to UV light. Nano-scaled titanium dioxide particles may be primarily used in sunscreen lotions, for example, because they scatter visible light while providing substantial UV protection. Further, the energy/light scattering layer 600 may include random or patterned voids 630 in the energy/light scattering layer 600, or through the energy/light scattering layer 600. In embodiments, patterned voids 630, such as those shown in FIG. 6, may reduce or substantially eliminate any need to otherwise re-filter or realign light impinging on a camera lens or other imaging device sensor.

As employed according to the disclosed schemes, titanium dioxide may be presented as a substantially-transparent semiconductor material with a wide band gap ($Eg=3.2$-$3.4$ (eV)) and a high refractive index ($n=2.5$-$2.9$). These characteristics allow the titanium dioxide to be used in conjunction with substantially transparent metal dielectric composites designed to obtain, or otherwise control, desired optical properties of the energy/light scattering layer 600 in the visible, and near-visual, light range. In embodiments, the metal dielectric composites may comprise such materials as silicon, gold and/or silver nanoparticles.

Colors of composites containing noble metal inclusions may be tuned based on surface plasmon resonance (SPR) for the composites in the metallic phase. Light scattering layers comprising films with well separated embedded metallic nano-particles, in dimensions significantly smaller than the wavelengths of the exciting light, may be characterized by a peak in the visible range of the absorption spectra. The bandwidth, intensity and possession of a maximum effect may depend on the composition of the surrounding dielectric matrix, and the size, distribution and shape of the metallic nano-particles. An ability to control these physical properties of substantially-transparent constituent components allows tuning of the optical properties of a composite material from which the light scattering layer may be formed. This tuning of the optical properties of the composite material may include one or more of (1) changing a refractive index of the matrix (NH) and (2) modifying the morphology and distribution of the metallic inclusions, thereby changing an aspect ratio of the metallic nano-particles. By applying a combination of plasmon resonance, and scattering of light by particles, the appearance of the color of an object having a light scattering surface layer comprised of substantially-transparent micrometer or sub-micrometer spheres, including components of the above-described exemplary nano-particles, can be directly and precisely controlled.

Final optical properties, or characteristics, of the energy/light scattering layer may be controlled and/or determined using a scattering theory. An example of such a scattering theory is the Mie Theory or the Mie Solution to Maxwell's Equations, which describes the scattering of an electromagnetic plane wave by a homogeneous sphere. The Mie Solution takes the form of an infinite series of spherical multipole partial waves. See generally Stratton, J. A., *Electromagnetic Theory*, McGraw-Hill (1941).

In embodiments, an apparent color or colors of the energy/light scattering layer may be created using the substantially-transparent micrometer or sub-micrometer spheres. One or more orders of multi layers may be formed by evaporating water from, for example, polystyrene latex suspensions, which may contain monodisperse spherical particles of a diameter smaller than the wavelength of visible light. See, e.g., Dushkin et al., "Colored Multilayers from Transparent Submicrometer-Spheres," *Protein Array Project, ERATO, JRDC,* 5-9-1 *Tokodai, Tsukuba,* 300-26, *Japan* (May 28, 1993).

In embodiments, the energy/light scattering layer may be formed by applying a photographic grade silver halide gel and using a chromoskedasic development process. Silver halide crystals in a gelatinous suspension may be coated on a base material, including glass, as a transparent composite body structure. The silver halide gel may be applied, for example, directly on a facing surface of a photocell. When the silver halide crystal is exposed to light, a sensitivity speck on the surface of the silver halide crystal is turned into a small speck of metallic silver. If the speck of metallic silver contains approximately four or more atoms, it is rendered developable, which meaning that it can undergo development that turns the entire crystal into metallic silver. Areas of the emulsion receiving larger amounts of light undergo the greatest development and therefore result in the highest optical density. In a chromoskedasic development process, the silver halide particles are carefully managed with different chemicals and/or exposure to light, to render those particles different sizes. These different-sized silver particles in turn scatter light in different ways to produce the different colors according to the Mie effect. The chemicals used to do this are often acetate buffered thiocyanate "stabilizers" and dilute potassium hydroxide "activators."

Photographic grade silver halide gel such as, for example, Liquid Light®, may be provided. In general, the silver halide gel may be a particular form of an enlargement-speed, silver-halide photographic emulsion. In this context, the silver halide gel is chosen such that it can be processed with standard photographic-type developers and fixers. Depending on a particular use case that is envisioned for the energy/light scattering layer, the silver halide gel is preferable in that it provides a non-toxic substance that does not contain any phenol or other like solvents.

Depending on a surface texture of an underlying base body structure, including a photocell, a surface preparation may be applied before the silver halide gel is subsequently applied to the receiving surface of the base body structure. In an instance in which a surface preparation is required, or otherwise preferred, an oil-based pre-coat can be used for good adhesion, and to additionally prevent potential for discoloration of the overlayers. Such pre-coats may include polyurethane, gelatinous pre-coats and/or photographic "subbing" solutions. An objective of the pre-coating is to provide a smooth surface that fuses the emulsion to the underlying receiving surface of the base body structure. It should be appreciated that, if the receiving surface to which the silver halide gel is to be applied is porous enough to anchor the emulsion, the silver halide gel may be applied directly onto the receiving surface of the base body structure without any pre-coating.

During the disclosed surface coating process, it is advantageous to use one of a medium amber, dark yellow, or red safelight, or other light source suitable for use in a photographic darkroom, while applying the silver halide gel. The safelight is chosen to provide illumination only from parts of the visible spectrum to which the silver halide gel is substantially insensitive. Because in this context the silver halide gel is relatively slow, silver halide gel can tolerate a large amount of safelight brightness and exposure without fogging. To maximize safelight output, a low-pressure sodium-vapor lamp with an amber filter may be used effectively during the surface coating process.

Once the receiving surface of the base body structure is properly prepared, as necessary, the silver halide gel is applied to the receiving surface using one or more of a brush, sponge, paint applicator, paint roller, sprayer, a jetting process or by flowing on and draining off the silver halide emulsion, or by other known or later developed application processes or methods. Multiple coats of the silver halide gel are applied over the receiving surface of the base body structure. As each silver halide gel layer sets up and becomes, for example, tacky, the each silver halide gel layer may be exposed and developed. Alternatively, the base body structure with the applied silver halide gel can be dried and stored for later use.

Once the light scattering layer has been prepared, the developing of the light scattering layer to achieve the desired color or pattern may proceed as follows.

A ten percent (10%) to twenty percent (20%) solution of both an activator (such as, for example, Kodak® 511 Activator), and a stabilizer (such as, for example, Kodak® Ektamatic S30 Stabilizer), may be appropriately mixed. Approximately one half ounce (0.5 oz.) of the activator and stabilizer solution may be added to four and a half ounces (4.5 oz.) of water to yield the ten percent (10%) solution. Approximately one ounce (1.0 oz.) of the activator and stabilizer solution may be added to four and a half ounces (4.0 oz.) of water to yield the twenty percent (20%) solution. By separately employing each of the two different solutions, additional control over the development process can be achieved. In alternative embodiments, a fifty percent (50%) solution of Dektol® developer can be used by diluting five ounces (5.0 oz., stock, not working strength) with five ounces (5 oz.) of water. It should be appreciated that other developers may be prepared in similar dilutions for use.

The light scattering layer to be formed of the silver halide on the base body structure is prepared and exposed by applying the fifty percent (50%) solution of the Dektol® on the area or areas of the light scattering layer where it is desired to develop a particular color. During development, additional developer can be applied, as needed, as the color or image appears in the light scattering layer.

After approximately 90 seconds, or when the color/image appears correct, water or another flooding or washing solution can be used to inhibit and ultimately stop the development process, thereby setting the color. When appropriate development is achieved, an approximately 10 percent (10%) solution of stabilizer may be applied to the portions of the light scattering layer that are adjacent to the developed areas produced above, if any, to set the colors of those adjacent portions as well.

A ten percent (10%) activator solution may be applied to selected portions of the light scattering layer. The exposed portions of the light scattering layer may also be exposed to fluorescent or other light to further develop the color/image in the light scattering layer.

Optionally, the fifty percent (50%) Dektol® solution may be applied to the light scattering layer to accelerate action. The color/image may be further developed with the ten percent (10%) and twenty percent (20%) solutions of the stabilizer and/or activator, or by adding the diluted Dektol® to darken colors.

Different intensity lights may alter the color or the depth of the color. Additionally, light and the activator and stabilizer solution as indicated generally above, react with the silver salts in the gelatinous silver halide emulsions to form metallic silver particles of different sizes. These varied particle sizes refract the light in the light scattering layer to create the varied hues. The color effects may be more pronounced at the interface of different color effects in an image wise presentation in a surface of a light scattering layer.

The colors are created when the different chemicals meet in the emulsion. When the chemical action of the developer is arrested (using the stabilizer) or accelerated (using the activator), the apparent color or colors may be progressively changed to that desired by the user. Additionally, different dilutions will produce different colors with altered intensities. Thus, it should be appreciated that colors, patterns, textures and/or imaging applied to the light scattering layer is a design choice of the user based on desired characteristics and/or functionalities of the light scattering layer and the condition, function and/or composition of the base body structure on which the light scattering layer is disposed and developed for use.

In the above-described manner, a finished and stabilized apparent colored, multi-component colored, texturized or otherwise image-developed surface transparent light scattering layer is produced. Mass production of such layers could be according to known printing or deposition and development methods for depositing the light scattering layer forming components on the base structures as layer receiving substrates, and automatically controlling the exposure, activation and/or stabilization of the surface components to achieve a particular colored, multi-colored, texturized and/or image-wise patterned light scattering layer surface.

Figure 7:
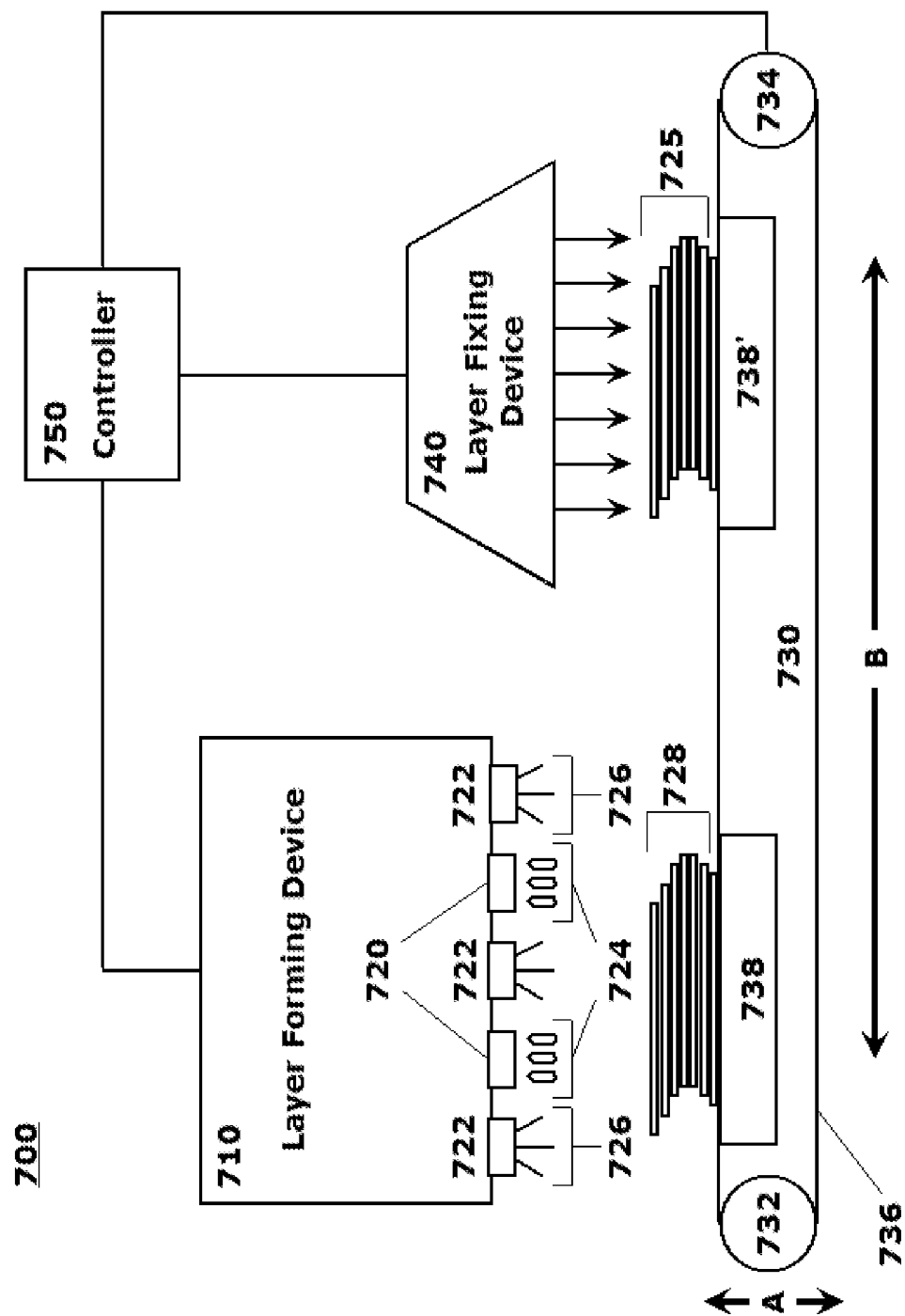
FIG. 7 illustrates a schematic diagram of an exemplary AM 3D object forming system usable for automated forming of energy/light scattering surface layers and/or 3D object body structures including energy/light scattering surface layers according to this disclosure.

FIG. 7 illustrates a schematic diagram of an exemplary AM 3D object forming system 700 usable for automated forming of 2D energy/light scattering layers or 3D object body structures including energy/light scattering layers according to this disclosure. The exemplary system 700 may be used to prepare and build individual energy/light scattering layers as additive layers on a base 3D body structure, or as individual layers themselves to be built up and laminated together on, for example, a build platform to form the 3D body structure in an AM 3D object build or forming process. In this manner, individual 2D energy/light scattering layer components may be individually produced and mechanically transferred to a build platform in an AM 3D object build process from, for example, a layer forming or developing station. Each additional 2D energy/light scattering layer component may be sequentially added to a stack of previously-processed 2D energy/light scattering layers that may already constitute a partial in-process 3D object on the build platform.

As shown in FIG. 7, the exemplary system 700 may include a layer forming device 710. The layer forming device 710 may comprise a plurality of liquid deposition units 720 that may be usable to dispose liquid components 724, including substantially-transparent particles of varying sizes and compositions (which may be dispersed in carrier solutions for the deposition process), substantially-transparent matrix materials, or combinations thereof, in the compositions and manners discussed above for the formation of energy/light scattering layers, and other compositions for forming different alignment layers, on a build platform 738, or on a previously-formed stack of formed and fixed energy/light scattering or laminate layers 728. Each layer, as appropriate, may be exposed to some form of radiating developer unit 722, from which, for example in the case of the formation of the light scattering where, safelight radiation 726 may be used to illuminate the in-process 2D light scattering layer in the layer formation portion of the AM 3D object build process. Although shown in FIG. 7 as essentially planar layers, the deposition processes and energy/light scattering layer development processes according to this disclosure are not limited to only planar layers. In embodiments, each layer may be separately formed on the in-process 3D object to sequentially build an object in the AM 3D object build process.

The build platform 738 may be translatable in direction A to optimally position the build platform 738 with respect to the layer forming device 710, in order to accommodate 3D object base structures and in-process 3D objects of varying sizes for optimal deposition and development of the laminate layers including an energy/light scattering layer, or a next energy/light scattering layer thereon.

The build platform 738 may be translatable in a direction B between a layer forming position opposite the layer forming device 710, and a layer fixing position (depicted as 738') opposite a layer fixing device 740 that may employ known layer fixing methods including using heat and/or pressure to fuse or otherwise fix each subsequent 2D energy/light scattering layer (or other separate laminate layer) on the stack of previously-processed 2D energy/light scattering layers (or other separate laminate layers) 728 as essentially laminate layers constituting the in-process 3D object. The build platform 738 may be translatable in direction B using, for example, a conveyor transport system 730 or other comparable transport system, including but not limited to, a robotic arm-type material transport device. The conveyor transport system 730, as depicted in FIG. 7, may comprise a series of conveyor rollers 732, 734 about which a conveyor belt 736 may be made to circulate. The conveyor transport system 730 may have elements that are movable vertically in direction A in order to accommodate the build process of the in-process 3D object with the deposition of each subsequent 2D laminate layer of a stack of 2D laminate layers 728. The conveyor transport system 730 may be usable to cycle the build platform 738 back and forth between the layer forming position and the layer fixing position to accommodate the transfer and fixing of each subsequent 2D laminate layer in the 3D object build process.

The exemplary system 700 may operate under the control of a processor or controller 750. Layer and object forming information may be input regarding a 3D model that is to be built from the set of laminate layers including at least one energy/light scattering layer printed and processed by the exemplary system 700. The controller 750 may be provided with 3D object forming data that is devolved, or parsed, into component data to execute a controllable process in which individual laminate layers, including particularly one or more energy/light scattering layers, are imaged and formed to produce a single color, a multi-color, texturized surface or an image-patterned presentation when viewed from the viewing, observation or energy/light incident side of the finished energy/light scattering layer or the finished 3D object of which the energy/light scattering layer is a component. The controller 750 may control movement of the conveyor transport system 730 and operation of the layer fixing device 740.

Figure 8:
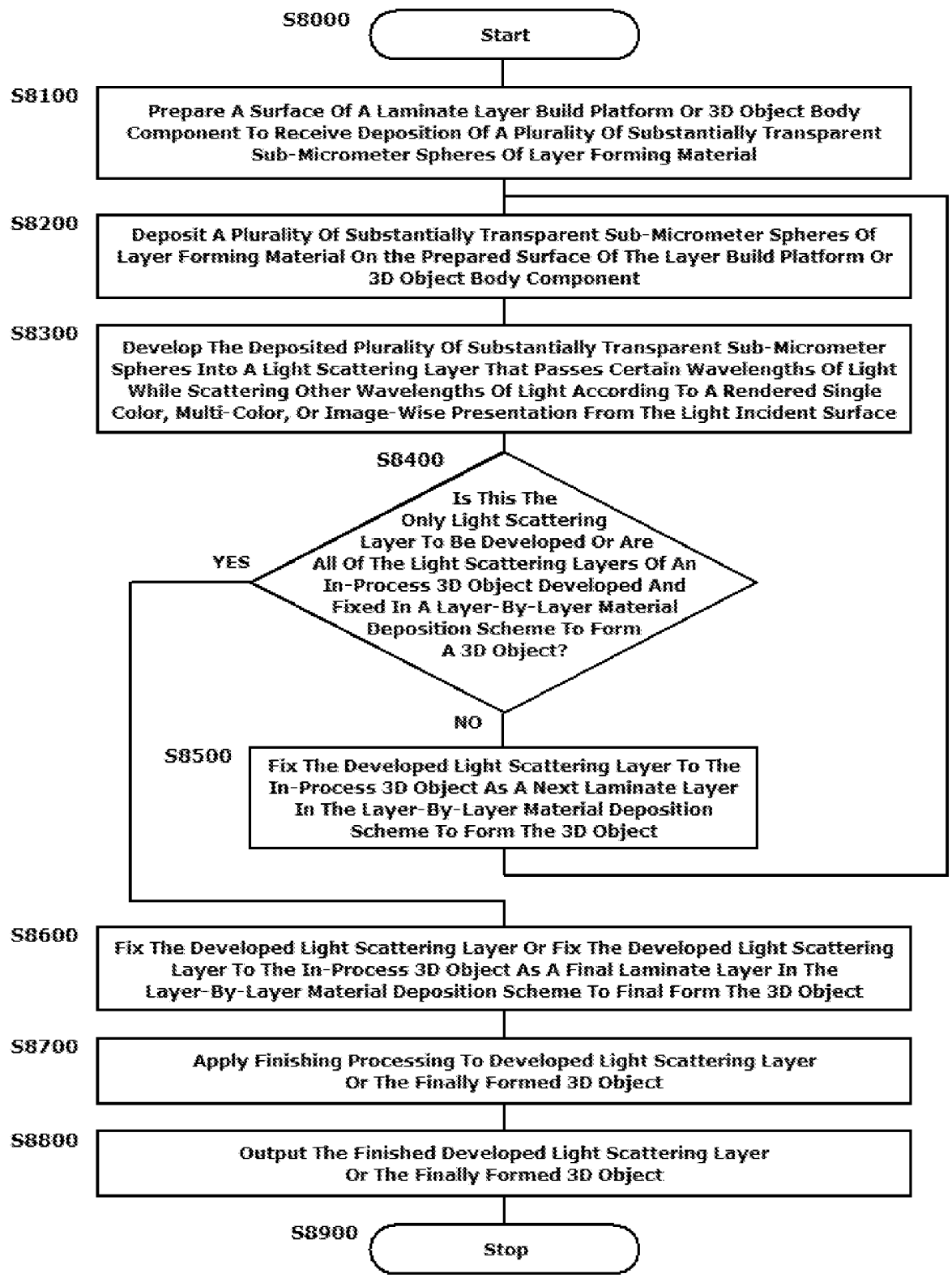
FIG. 8 illustrates a flowchart of an exemplary method for an energy/light scattering surface layer forming scheme or a 3D object forming scheme for forming objects including at least an energy/light scattering surface layer according to this disclosure.

The disclosed embodiments may include methods for implementing an energy/light scattering layer forming scheme, or a 3D object forming scheme for forming objects including an energy/light scattering surface layer. FIG. 8 illustrates a flowchart of such an exemplary method. As shown in FIG. 8, operation of the method commences at Step S8000 and proceeds to Step S8100.

In Step S8100, a surface of a laminate layer build platform or a surface of an in-process 3D object body component may be prepared or conditioned to receive deposition of a plurality of substantially-transparent micrometer or sub-micrometer spheres of layer forming material, the spheres being in a range of 25 microns or less. The surface preparation may include deposition of one or more substantially-transparent matrix component materials, including, but not limited to, dielectric component materials, on the laminate layer build platform or the surface of the in-process 3D object body onto which the plurality of substantially-transparent micrometer or sub-micrometer spheres of layer forming material may be deposited. Operation of the method proceeds to Step S8200.

In Step S8200, a plurality of substantially-transparent micrometer or sub-micrometer spheres of layer forming material may be deposited on the prepared surface of the layer build platform or the 3D object body component. Operation of the method proceeds to Step S8300.

In Step S8300, the deposited plurality of substantially-transparent micrometer or sub-micrometer spheres may be developed into an energy/light scattering layer that passes certain wavelengths of energy/light through the layer based on scattering other selectable wavelengths of energy/light according to, for example of selectable scattered wavelengths in the visual light range, a rendered perceptibly single color, multi-color, patterned, texturized or image-wise presentation of scattered light from the light incident surface of the energy/light scattering layer according to the above-described schemes. Operation of the method proceeds to Step S8400.

Step S8400 is a determination step in which it is determined whether the prepared energy/light scattering layer is the only energy/light scattering layer to be developed, or whether all of the energy/light scattering layers of an in-process 3D object are developed and fixed in a layer-by-layer material deposition scheme to form a 3D object in, for example, an AM object forming process.

If in Step S8400, it is determined that the prepared energy/light scattering layer is not the only energy/light scattering layer to be developed, or that all of the energy/light scattering layers of in-process 3D object are not developed and fixed in a layer-by-layer material deposition scheme to form a 3D object operation of the method proceeds to Step S8500.

In Step S8500, the developed energy/light scattering layer may be fixed to the in-process 3D object is a next laminate layer in the layer-by-layer material deposition scheme to form the 3D object. Operation of the method reverts to Step S8200.

If in Step S8400, it is determined that the prepared energy/light scattering layer is the only light scattering layer to be developed, or all of the energy/light scattering layers of the in-process 3D object are developed and fixed in the layer-by-layer material deposition scheme to form the 3D object, operation of the method proceeds to Step S8600.

In Step S8600, the prepared energy/light scattering layer as the only light scattering layer to be developed, or the last of the energy/light scattering layers that form the in-process 3D object may be fixed in a final form. Operation the method proceeds to Step S8700.

In Step S8700, a finishing processing may be applied to the developed energy/light scattering layer or the finally-formed 3D object. Operation of the method proceeds to Step S8800.

In Step S8800, the formed and finished energy/light scattering layer or finally-formed and finished 3D object may be output from the AM 3D object forming system. Operation of the method proceeds to Step S8900, where operation of the method ceases.

The disclosed embodiments may include a non-transitory computer-readable medium storing instructions which, when executed by a processor, may cause the processor to execute all, or at least some, of the steps of the method outlined above.

As is indicated above, refractive indices of the energy/light scattering layers can be modified according to a number of mechanisms. These mechanisms include the physical and formulaic compositions of the particles and the matrix materials in which the particles are dispersed and fixed, as well as any voids in the composite material layers. Compositions of the micrometer or sub-micrometer spheres may include multiple layers having different refractive indices.

Figure 9:
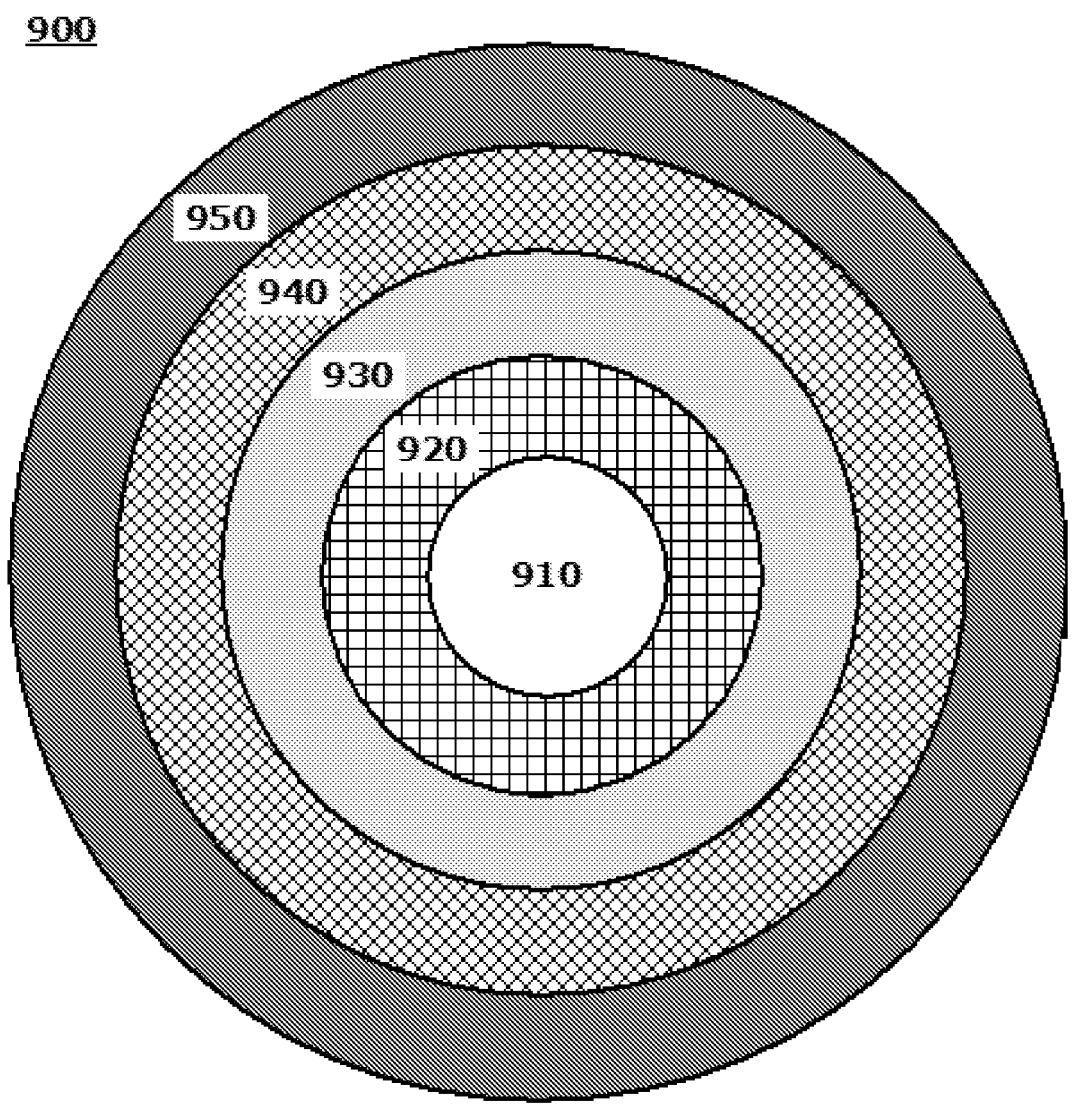
FIG. 9 illustrates a schematic diagram of an exemplary detail of a multi-layer individual micrometer or sub-micrometer sphere usable in a light scattering layer according to this disclosure.

FIG. 9 illustrates a schematic diagram of an exemplary detail of a multi-layer individual micrometer or sub-micrometer sphere 900 usable in an energy/light scattering layer according to this disclosure. The substantially-transparent particles of the disclosed embodiments may be of layered construction as shown. Each layer 910-950 may exhibit a different index of refraction. The number of particle layers may be varied over a range required by a particular application and/or use case. Such a particle composition allows for additional degrees of freedom in adjusting the color, transmission and scattering, i.e., in "tuning" the energy/light scattering effects produced by the composition of the energy/light scattering layer.

Figure 10:
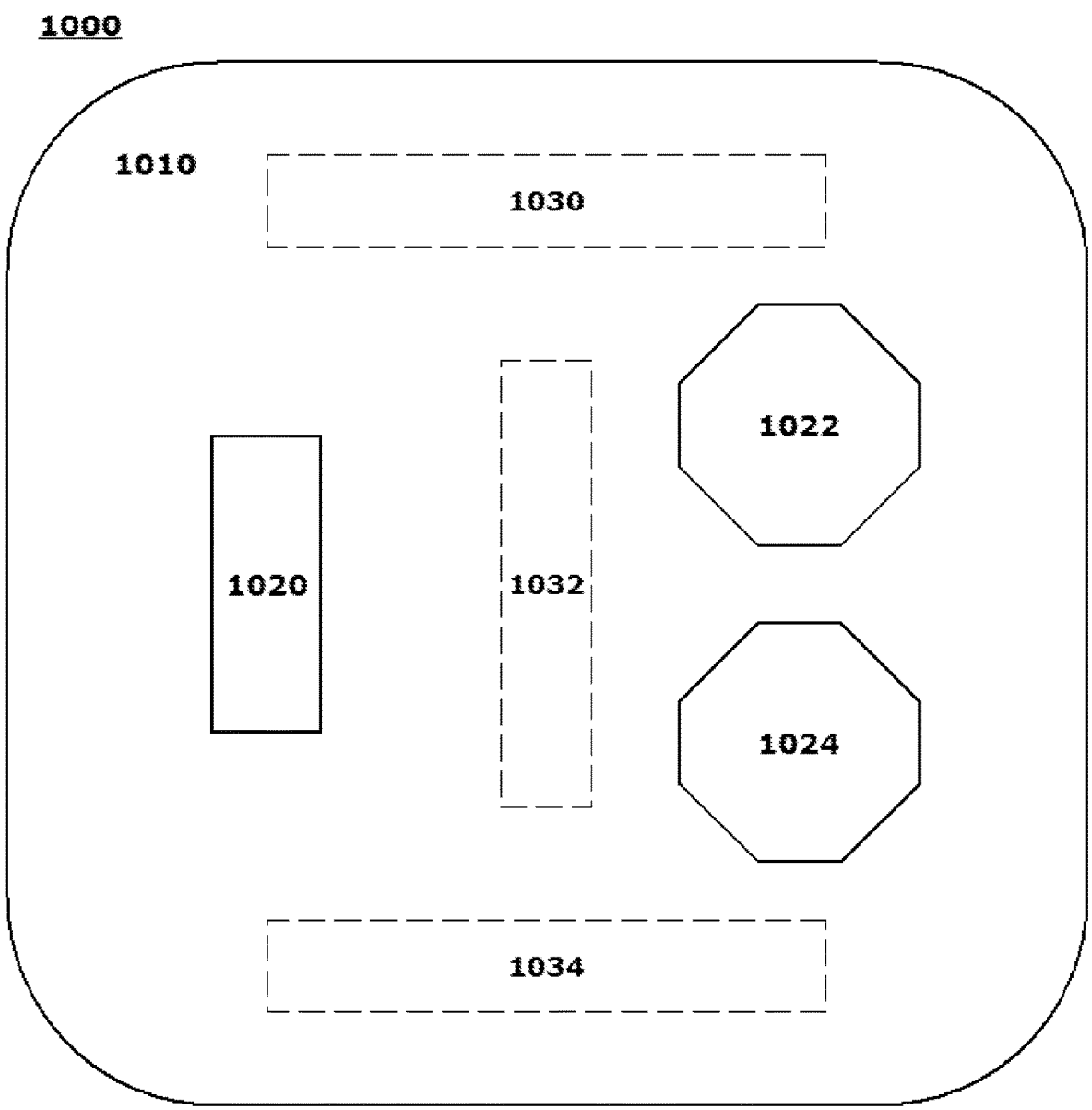
FIG. 10 illustrates a schematic diagram of an exemplary wall plate that incorporates at least discrete portions formed of energy/light scattering layers according to this disclosure.

As is described in some detail above, the systems and methods according to this disclosure may be directed at forming common objects in a unique manner out of substantially-transparent component materials to have particular energy/light scattering characteristics that cause the combination of substantially-transparent component materials to appear, for example, opaque when exposed to incident energy with wavelengths in the visual light spectrum. FIG. 10 illustrates a schematic diagram of an exemplary wall plate 1000 that incorporates at least discrete portions formed of energy/light scattering layers according to this disclosure. Such a wall plate 1000 may be usable in a typical residential and/or commercial configuration having a wall plate surface 1010 with openings 1020,1022,1024 to accommodate one or more of a mechanically-movable switch and/or receptacle components as may be typically found in an underlying gang box.

In embodiments, the wall plate surface 1010 may be an example of a solid object body structure formed entirely of an energy/light scattering layer according to the above description. In separate embodiments, the wall plate surface 1010 may be formed substantially of a conventional material in a specified color, while accommodating within its plan form certain discrete portions 1030,1032,1034 formed of one or more energy/light scattering layers. In either construct, the energy/light scattering layers of the exemplary wall plate 1000 may cover typical electrical switches, outlets and other residential and commercial installations. In embodiments, underlying switch boxes and/or outlet boxes may be configured to include energy- and/or light-activated sensors, devices, power generation components or the like. Provision of a wall plate 1000 according to the disclosed embodiments may facilitate energy transmission through the wall plate 1000, either entirely or in discrete portions while maintaining an opaque appearance, to the underlying sensors, devices or components. In embodiments, such underlying sensors, devices or components may be affixed to the box side (non-light-incident side) of the wall plate 1000, or may be otherwise affixed to one or more of the underlying components or to sides of the gang box itself. It should be appreciated that no particular limiting configuration of the disclosed wall plate 1000 is intended to be implied by the exemplary depiction in FIG. 10.

The above-described exemplary systems and methods reference certain conventional components, sensors, materials, and real-world use cases to provide a brief, general description of suitable operating, product processing, energy/light scattering layer forming and 3D object forming or AM environments in which the subject matter of this disclosure may be implemented for familiarity and ease of understanding. Although not required, embodiments of the disclosure may be provided, at least in part, in a form of hardware circuits, firmware, or software computer-executable instructions to control or carry out the specific energy/light scattering layer forming functions described. These may include individual program modules executed by processors.

Those skilled in the art will appreciate that other embodiments of the disclosed subject matter may be practiced in many disparate film forming, layer forming, laminate layer forming, 3D object forming, AM 3D object forming, and/or wall plate forming systems, techniques, processes and/or devices, including various machining, molding, additive and subtractive layer forming and manufacturing methods, of many different configurations.

As indicated above, embodiments within the scope of this disclosure may include computer-readable media having stored computer-executable instructions or data structures that can be accessed, read and executed by one or more processors for controlling the disclosed energy/light scattering layer forming and 3D object forming schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, computer-aided design (CAD) or computer-aided manufacturing (CAM) of particular objects, object structures, layers, layer components and/or wall plates (as a particular example of a real-world use case).

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of executable instructions or associated data structures for carrying into effect those executable instructions represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 8, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

We claim:

1. An energy scattering layer, comprising:
   a plurality of substantially-transparent non-layered particles wherein said substantially-transparent non-layered particles are characterized as having a diameter up to 25 microns; and
   a substantially-transparent matrix material that fixes the particles in a layer arrangement to form an energy scattering layer,
   the energy scattering layer having an energy-incident side,
   the particles being fixed in the matrix material such that each particle of the plurality of substantially-transparent particles is separated from each adjacent particle by an interstitial void in a manner that causes the layer arrangement to
      reflect substantially all of one or more selectable wavelengths of incident energy impinging on the energy scattering layer from the energy-incident side, and
      pass other wavelengths of the incident energy through the energy scattering layer;
   the one or more selectable wavelengths of incident energy being determined by a scattering of incident energy based on 1) size of the substantially-transparent particles, an index of refraction of the materials comprising the substantially-transparent particles, a material composition of the matrix material, a size of the interstitial voids between the substantially-transparent particles; and 2) a surface plasmon resonance of the energy scattering layer.

2. The energy scattering layer of claim 1, wherein said particles comprise a plurality of layers, and wherein each layer of said plurality of layers displays a different index of refraction.

3. The energy scattering layer of claim 1, the particles comprising metallic nano-particles, the metallic nano-particles being excited according to a surface plasmon resonance of the metallic nano-particles to reflect the selectable wavelengths of incident energy.

4. The energy scattering layer of claim 1, the particles comprising metallic nano-particles, at least some of the metallic nano-particles being titanium dioxide nano-particles, and the matrix material comprising a dielectric material.

5. The energy scattering layer of claim 2,
   the particles comprising silver halide crystals;
   the matrix material comprising a gelatinous emulsion in which the silver halide crystals are immersed to form the layer arrangement; and
   index of refraction of the particles being modified by a development process.

6. The energy scattering layer of claim 5, the development process being a chromoskedasic development process.

7. The energy scattering layer of claim 1, the incident energy comprising incident light in the visual spectrum,
   a configuration of the energy scattering layer causing the reflection of the at least some selectable wavelengths of incident energy impinging on the energy scattering layer from the energy-incident side to render a visually opaque appearance to the energy scattering layer when viewed from the energy-incident side.

8. The energy scattering layer of claim 7, the layer arrangement being configured to reflect selectable wavelengths of the incident light as substantially same wavelengths of the incident light from the energy-incident side in a manner that causes the energy-incident side to appear as a single-color opaque surface.

9. The energy scattering layer of claim 7, the layer arrangement being configured to reflect selectable wavelengths of the incident light by reflecting a first wavelength of the incident light from first portions of the energy-incident side having a first index of refraction and at least one second wavelength of the incident light from one or more second portions of the energy incident side having one or more second indices of refraction in a manner that causes the energy-incident side to appear as at least one of a multi-color or texturized opaque surface.

10. The energy scattering layer of claim 7, the layer arrangement being configured to reflect selectable wavelengths of the incident light by reflecting a plurality of wavelengths of the incident light from a plurality of individually discrete portions of the energy-incident side having a plurality of indices of refraction in a manner that causes the energy-incident side to appear as an imaged opaque surface presenting a pre-determined multi-color image.

* * * * *